United States Patent
Oh

(10) Patent No.: US 9,213,389 B2
(45) Date of Patent: *Dec. 15, 2015

(54) NON-VOLATILE SEMICONDUCTOR MEMORY DEVICE WITH POWER-SAVING FEATURE

(75) Inventor: HakJune Oh, Kanata (CA)

(73) Assignee: Conversant Intellectual Property Management Inc., Ottawa (CA)

( * ) Notice: Subject to any disclaimer, the term of this patent is extended or adjusted under 35 U.S.C. 154(b) by 569 days.

This patent is subject to a terminal disclaimer.

(21) Appl. No.: 13/617,908

(22) Filed: Sep. 14, 2012

(65) Prior Publication Data

US 2013/0010563 A1  Jan. 10, 2013

Related U.S. Application Data

(63) Continuation of application No. 12/488,278, filed on Jun. 19, 2009, now Pat. No. 8,291,248, which is a continuation-in-part of application No. 12/210,580, filed on Sep. 15, 2008, now Pat. No. 8,145,925.

(60) Provisional application No. 61/015,724, filed on Dec. 21, 2007, provisional application No. 61/048,737, filed on Apr. 29, 2008.

(51) Int. Cl.
G06F 1/26 (2006.01)
G06F 1/32 (2006.01)
(Continued)

(52) U.S. Cl.
CPC ............ *G06F 1/3203* (2013.01); *G06F 1/12* (2013.01); *G06F 1/3275* (2013.01); *G11C 16/16* (2013.01); *G11C 16/32* (2013.01); *Y02B 60/1228* (2013.01)

(58) Field of Classification Search
USPC .................................................. 713/300–340
See application file for complete search history.

(56) References Cited

U.S. PATENT DOCUMENTS 5,167,024 A  11/1992  Smith et al.
5,313,429 A  5/1994  Chevallier et al.
(Continued)

FOREIGN PATENT DOCUMENTS

JP  11185470  7/1999
JP  11339484  12/1999
(Continued)

OTHER PUBLICATIONS

"1G Bits DDR3 SDRAM, Preliminary Data Sheet E1128E10 (Ver. 1.0)", http://www.commsdesign.com/show/Article.jhtml?articleID=183700957, 1-130, Aug. 1, 2007.
(Continued)

*Primary Examiner* — Paul R Myers
(74) *Attorney, Agent, or Firm* — Daniel Hammond

(57) ABSTRACT

A non-volatile semiconductor memory device, comprising: an interface for receiving commands issued by a controller, the commands including an erase command; a functional entity with circuit components and having a terminal; a node; switchable circuitry capable of controllably switching between a first operational state in which the terminal is electrically connected to the node and a second operational state in which the terminal is electrically decoupled from the node, the node being configured to have a signal for the functional entity communicated through it when the switchable circuitry is in the first operational state; and a command processing unit configured to recognize the commands issued by the controller and, in response to recognizing the erase command, to cause the switchable circuitry to switch from the first operational state to the second operational state.

14 Claims, 11 Drawing Sheets

(51) Int. Cl.
  *G06F 1/12* (2006.01)
  *G11C 16/16* (2006.01)
  *G11C 16/32* (2006.01)

(56) References Cited

U.S. PATENT DOCUMENTS

| | | |
|---|---|---|
| 5,333,300 A | 7/1994 | Fandrich |
| 5,452,259 A | 9/1995 | McLaury |
| 5,473,563 A | 12/1995 | Suh et al. |
| 5,526,311 A | 6/1996 | Kreifels et al. |
| 5,541,879 A | 7/1996 | Suh et al. |
| 5,546,341 A | 8/1996 | Suh et al. |
| 5,703,807 A * | 12/1997 | Smayling et al. ........ 365/185.03 |
| 5,708,611 A | 1/1998 | Iwamoto et al. |
| 5,765,002 A | 6/1998 | Garner et al. |
| 5,778,419 A | 7/1998 | Hansen et al. |
| 5,796,673 A | 8/1998 | Foss et al. |
| 5,806,070 A | 9/1998 | Norman et al. |
| 5,903,496 A | 5/1999 | Kendall et al. |
| 5,926,434 A | 7/1999 | Mori |
| 5,973,552 A | 10/1999 | Allan |
| 6,026,465 A | 2/2000 | Mills et al. |
| 6,052,331 A | 4/2000 | Araki et al. |
| 6,087,868 A | 7/2000 | Millar |
| 6,091,660 A | 7/2000 | Sasaki et al. |
| 6,148,363 A | 11/2000 | Lofgren et al. |
| 6,216,233 B1 | 4/2001 | Baweja |
| 6,317,812 B1 | 11/2001 | Lofgren et al. |
| 6,438,060 B1 | 8/2002 | Li et al. |
| 6,442,644 B1 | 8/2002 | Gustavson et al. |
| 6,570,791 B2 | 5/2003 | Roohparvar et al. |
| 6,605,969 B2 | 8/2003 | Mikhalev et al. |
| 6,654,848 B1 * | 11/2003 | Cleveland et al. ............ 711/103 |
| 6,696,865 B2 | 2/2004 | Horiguchi et al. |
| 6,707,747 B2 | 3/2004 | Zitlaw et al. |
| 6,715,044 B2 | 3/2004 | Lofgren et al. |
| 6,788,588 B2 | 9/2004 | Nagai et al. |
| 6,791,889 B2 | 9/2004 | Peterson |
| 6,809,990 B2 | 10/2004 | Thomann et al. |
| 6,842,396 B2 | 1/2005 | Kono |
| 6,850,458 B2 | 2/2005 | Li |
| 7,031,221 B2 | 4/2006 | Mooney et al. |
| 7,078,950 B2 | 7/2006 | Johnson |
| 7,096,283 B2 | 8/2006 | Roohparvar |
| 7,177,208 B2 | 2/2007 | Smith et al. |
| 7,227,383 B2 | 6/2007 | Hoberman et al. |
| 7,292,061 B2 | 11/2007 | Oh |
| 7,298,670 B2 | 11/2007 | Werner et al. |
| RE40,147 E | 3/2008 | Aizawa |
| 2001/0010650 A1 | 8/2001 | Lee |
| 2002/0122347 A1 | 9/2002 | Frulio et al. |
| 2004/0027866 A1 | 2/2004 | Pekny |
| 2004/0042319 A1 | 3/2004 | Lee |
| 2004/0148482 A1 | 7/2004 | Grundy et al. |
| 2005/0105363 A1 | 5/2005 | Ko |
| 2005/0146981 A1 | 7/2005 | Ahn |
| 2005/0232008 A1 | 10/2005 | Shukuri et al. |
| 2005/0265073 A1 | 12/2005 | Chae et al. |
| 2006/0020764 A1 * | 1/2006 | Kim et al. .................... 711/168 |
| 2006/0044029 A1 | 3/2006 | Gomm et al. |
| 2006/0119991 A1 | 6/2006 | Garg et al. |
| 2007/0058480 A1 | 3/2007 | Hwang |
| 2007/0076502 A1 | 4/2007 | Pyeon et al. |
| 2007/0096774 A1 | 5/2007 | Yang et al. |
| 2007/0109833 A1 | 5/2007 | Pyeon et al. |
| 2007/0153576 A1 | 7/2007 | Oh et al. |
| 2007/0234100 A1 | 10/2007 | Baker et al. |
| 2007/0258295 A1 | 11/2007 | Kagan et al. |
| 2007/0268777 A1 | 11/2007 | Brox |
| 2007/0279112 A1 | 12/2007 | Maeda et al. |
| 2008/0088358 A1 | 4/2008 | Caplan et al. |
| 2008/0089167 A1 | 4/2008 | Dono |
| 2008/0168296 A1 | 7/2008 | Oh et al. |
| 2008/0198682 A1 | 8/2008 | Pyeon |
| 2008/0201588 A1 | 8/2008 | Pyeon et al. |
| 2008/0219053 A1 | 9/2008 | Kim |
| 2008/0226004 A1 | 9/2008 | Oh |
| 2009/0164830 A1 | 6/2009 | Oh |
| 2009/0259873 A1 | 10/2009 | Oh |

FOREIGN PATENT DOCUMENTS

| | | |
|---|---|---|
| JP | 2001060391 | 3/2001 |
| JP | 2001526443 | 12/2001 |
| JP | 2003123488 | 4/2003 |
| JP | 2005092957 | 4/2005 |
| JP | 2006065922 | 3/2006 |
| JP | 2007080415 | 3/2007 |

OTHER PUBLICATIONS

"1GB Q-Die DDR2 SDRAM Specification", 1-45, Sep. 1, 2007.
Takeuchi, K. et al, A 56NM CMOS 99MM2 8GB Multi-Level NAND Flash Memory With 10MB/S Program Throughput,Solid-State Circuits, 2006 IEEE International Conference Digest of Technical Papers, Session 7, ISBN:1-4244-0079-1, 10 pages, Feb. 6, 2006.
"Clocking Lecture 2 and 3, Purpose-Clocking Design Topics", 1-42, Dec. 4, 2002.
"DDR2 Fully Buffered DIMM 240 Pin FBDIMMS Based on 512 MB C-Die" (ROHS Compliant) Rev. 1.3, 1-32, Sep. 1, 2006.
"DDR2 SDRAM, Device and Operating and Timing Diagram", 1-46, May 1, 2007.
"Double Data Rate (DDR) SDRAM", 1GB: ×4, ×8, 16 DDR SDRAM, Rev. A 5/07, 1-82, Jan. 1, 2003.
Kao, James T, "Dual Threshold Voltage Techniques for Low Power Digital Circuits", IEEE Journal Solid-State Circuits, vol. 35, No. 7, 1-10, Jul. 1, 2000.
Shahed, Ameer, "Enabling Platform Non-Volatile Memory Solutions", Intel Developer Forum, 1-38, Feb. 13, 2008.
Hypertransport TM I/O Link Specification, Revision 2.00b, Document No. HTC20031217-0036-0010, Hyperstransport Technology Consortium, 1-325, Apr. 27, 2005.
Cooke, Jim, "Flash Memory 101: An Introduction to NAND Flash", http://www.commsdesign.com/show/Article.jhtml?articleID=183700957, 1-10, Mar. 31, 2008.
Hypertransport TM IO Link Specification, Revision 3.00, Document No. HTC20051222-0046-0008, Hyperstransport Technology Consortium, 1-97, Apr. 21, 2006.
IEEE Standard for High-Bandwidth Memory Interface Based on Scalable Coherent Interface (SCI) Signaling Technology (Ramlink), IEEE Std. 1596.4-1996, The Institute of Electrical Electronics Engineers, Inc., 98 pages, Mar. 19, 1996.
Ziaie, Kazem, "International Patent Application No. PCT/CA2008/001623, Search Report", 65-66, Nov. 20, 2008.
Myers, Paul R., Office Action dated Feb. 2, 2012; U.S. Appl. No. 12/488,278.
"ONFI, ONFI Breaks Speed Barrier for NAND Flash", Search Results for Google, 1-3, Nov. 14, 2007.
"ONFI, Open NAND Flash Interface Specification, Revision 1.0", 1-106, Dec. 28, 2006.
"ONFI, Open NAND Flash Interface Specification, Revision 2.0", 1-174, Feb. 27, 2008.
Kao, J, "Part II Leakage Reduction Techniques", ICCAD, 1-50, Jan. 1, 2002.
Hypertransport TM I/O Link Specification, Revision 3.00a, Document #HTC20051222-0046-0017, 1-129, Nov. 22, 2006.
Hypertransport TM I/O Link Specification, Revision 3.00a, Document #HTC20051222-0046-0017, 130-232, Nov. 22, 2006.
Hypertransport TM I/O Link Specification, Revision 3.00a, Document #HTC20051222-0046-0017, 233-319, Nov. 22, 2006.
Hypertransport TM I/O Link Specification, Revision 3.00a, Document #HTC20051222-0046-0017, 320-443, Nov. 22, 2006.
Hypertransport TM IO Link Specification, Revision 3.00, Document No. HTC20051222-0046-0008, Hyperstransport Technology Consortium, 98-206, Apr. 21, 2006.
Hypertransport TM IO Link Specification, Revision 3.00, Document No. HTC20051222-0046-0008, Hyperstransport Technology Consortium, 207-315, Apr. 21, 2006.

(56) References Cited

OTHER PUBLICATIONS

Hypertransport TM IO Link Specification, Revision 3.00, Document No. HTC20051222-0046-0008, Hyperstransport Technology Consortium, 316-428, Apr. 21, 2006.

Takeuchi, Ken et al., "A 56nm CMOS 99mm2 8Gb Multi-level NAND Flash Memory with 10MB/s Program Throughput", ISSCC 2006 / Session 7 / Non-Volatile Memory / 7.7, 2006, IEEE International Solid-State Circuits Conference, 1-4244-0079-1/06 ©2006 IEEE, 10 Pages.

Takeuchi, Ken et al., "A 56-nm CMOS 99-mm2 8-Gb Multi-Level NAND Flash Memory With 10-MB/s Program Throughput", IEEE Journal of Solid-State Circuits, vol. 42, No. 1, Jan. 2007, pp. 219-232.

"Hyperlink NAND (HLNAND TM) Flash Specification HL1-200/ HL1-266; Version 1.61", 1-83, May 25, 2007.

Kim, Jin-Ki, "Partial Block Erase Architecture for Flash Memory", 1-52, Apr. 16, 2008.

Ziaie, Kazem, "International Patent Application No. PCT/CA2008/ 001623, Written Opinion", 1-3, Nov. 20, 2008.

Xuxing, Chen, "U.S. Appl. No. 12/210,580, Office Action", 1-21, May 26, 2011.

NAND Flash Memory Features, 4GB, 8GB, and 16GB x8 Rev. B 2/07, 1-81, Feb. 1, 2007.

Maneatis, John G., "Low-Jitter Process-Independant DLL and PLL Based on Self-Biased Techniques" IEEE Journal of Solid-State Circuits vol. 31 No. 11, 1-10, Nov. 1, 1996.

Nakagaome, Y. et al, "Review and Future Prospects of Low-Voltage RAM Circuits", 1-28, Sep. 1, 2003.

\* cited by examiner

NON-VOLATILE SEMICONDUCTOR MEMORY DEVICE WITH POWER-SAVING FEATURE

CROSS-REFERENCE TO RELATED APPLICATIONS

The present application is a continuation, claiming the benefit under 35 U.S.C. 120 of U.S. patent application Ser. No. 12/488,278 filed on Jun. 19, 2009, now U.S. Pat. No. 8,291,248 which is a continuation-in-part, claiming the benefit under 35 U.S.C. 120 of U.S. patent application Ser. No. 12/210,580, filed on Sep. 15, 2008, now U.S. Pat. No. 8,145,925 and claiming the benefit under 35 U.S.C. 119(e) of U.S. Provisional Patent Application Ser. No. 61/015,724, filed on Dec. 21, 2007 and (ii) U.S. Provisional Patent Application Ser. No. 61/048,737, filed on Apr. 29, 2008. The aforementioned applications are all hereby incorporated by reference herein.

BACKGROUND

Re-writable non-volatile memory is used for various purposes mainly related to persistent data storage with possibility of modification. Practical applications of re-writable non-volatile memory include storage of digital pictures, computer files, digitally recorded music and so on. Thus, it is common to find re-writable non-volatile memory in everyday electronic devices such as computers, digital cameras, MP3 players, answering machines, cell phones, etc.

There are many ways in which data can be physically stored by a non-volatile memory device that also allows re-writing. One example is by using a magnetic disk as can be found in many computer hard drives. Another example is by way of an optical disk such as a CD-R/W. Yet another example is by means of a solid state memory circuit such as an electrically erasable and programmable read-only memory (EE-PROM), a specific example of which is a flash memory device. A flash memory device utilizes a high voltage to erase a large block of non-volatile memory cells in one operation, allowing these cells to then be reprogrammed with new data. By virtue of their robustness, convenience and low cost, flash memory devices have gained immense popularity in the marketplace for non-volatile memory and are expected to become even more dominant as the demand for non-volatile memory continues to grow unabated.

In the years since flash memory was first introduced, technological refinements have been made in order to allow flash memory devices to be operated at increasingly higher speeds. This has further expanded the breadth of consumer applications in which flash memory devices can be used to include, for example, certain video and photo related applications. However, faster operation of a flash memory device can also lead to specific problems when attempting to create a large high-speed memory system. In particular, the electrical power consumption of a flash memory device, which increases with operating frequency, can significantly limit the practically attainable capacity of the memory system.

Against this background, there is clearly a need for a non-volatile memory device with reduced power consumption.

SUMMARY

A first aspect of the present invention seeks to provide a non-volatile semiconductor memory device, comprising:
an interface for receiving commands issued by a controller, the commands including an erase command;
a functional entity with circuit components and having a terminal;
a node;
switchable circuitry capable of controllably switching between a first operational state in which the terminal is electrically connected to the node and a second operational state in which the terminal is electrically decoupled from the node, the node being configured to have a signal for the functional entity communicated through it when the switchable circuitry is in the first operational state; and
a command processing unit configured to recognize the commands issued by the controller and, in response to recognizing the erase command, to cause the switchable circuitry to switch from the first operational state to the second operational state.

A second aspect of the present invention seeks to provide a method implemented by a non-volatile semiconductor memory device that includes a node and a functional entity with circuit components and a terminal, the method comprising:
causing the device to switch from a first operational state to a second operational state in response to recognizing an erase command received from a controller;
electrically connecting the terminal to the node when the device is in the first operational state; and
electrically decoupling the terminal from the node when the device is in the second operational state.

A third aspect of the present invention seeks to provide a computer-readable storage medium comprising computer-readable instructions which, when processed, are used to generate a non-volatile semiconductor memory device that includes a node and a functional entity with circuit components and a terminal, and having functionality for:
switching from a first operational state to a second operational state in response to recognizing an erase command received from a controller;
electrically connecting the terminal to the node when the device is in the first operational state; and
electrically decoupling the terminal from the node when the device is in the second operational state.

A fourth aspect of the present invention seeks to provide a system, comprising:
a controller configured to issue commands including an erase command; and
a non-volatile semiconductor memory device, which comprises:
an interface for receiving the commands issued by the controller;
a functional entity with circuit components and having a terminal;
a node;
switchable circuitry capable of controllably switching between a first operational state in which the terminal is electrically connected to the node and a second operational state in which the terminal is electrically decoupled from the node, the node being configured to have a signal for the functional entity communicated through it when the switchable circuitry is in the first operational state; and
a command processing unit configured to recognize the commands issued by the controller and, in response to recognizing the erase command, to cause the switchable circuitry to switch from the first operational state to the second operational state.

DETAILED DESCRIPTION

Figure 1:
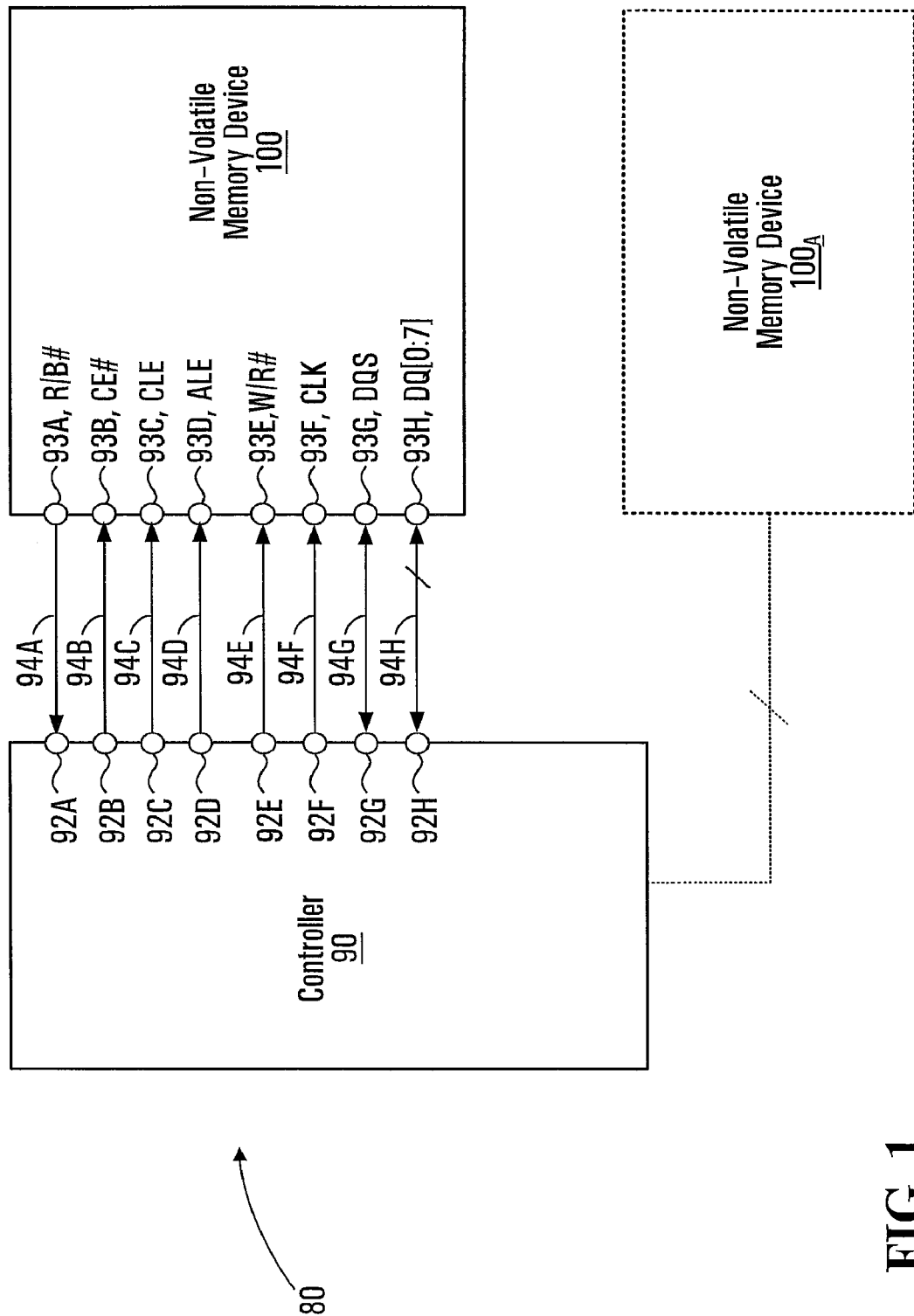
FIG. 1 is a block diagram of a memory system comprising a controller and a non-volatile semiconductor memory device, in accordance with a non-limiting example embodiment of the present invention.

Reference is made to FIG. 1, which illustrates a memory system 80 in accordance with an example embodiment. The memory system 80 comprises a controller 90 communicatively coupled to a non-volatile semiconductor memory device 100. The controller 90 may also be communicatively coupled to other memory devices $100_A$.

The controller 90 comprises a set of ports 92A . . . 92H, which are respectively connected to a set of ports 93A . . . 93H of the non-volatile semiconductor memory device 100. The controller 90 and the non-volatile semiconductor memory device 100 exchange device-external electrical signals 94A . . . 94H via their respective sets of ports, 92A . . . 92H and 93A . . . 93H. The ports 93A . . . 93H of the non-volatile semiconductor memory device 100 and the device-external signals 94A . . . 94H will be described in greater detail herein below.

Figure 2:
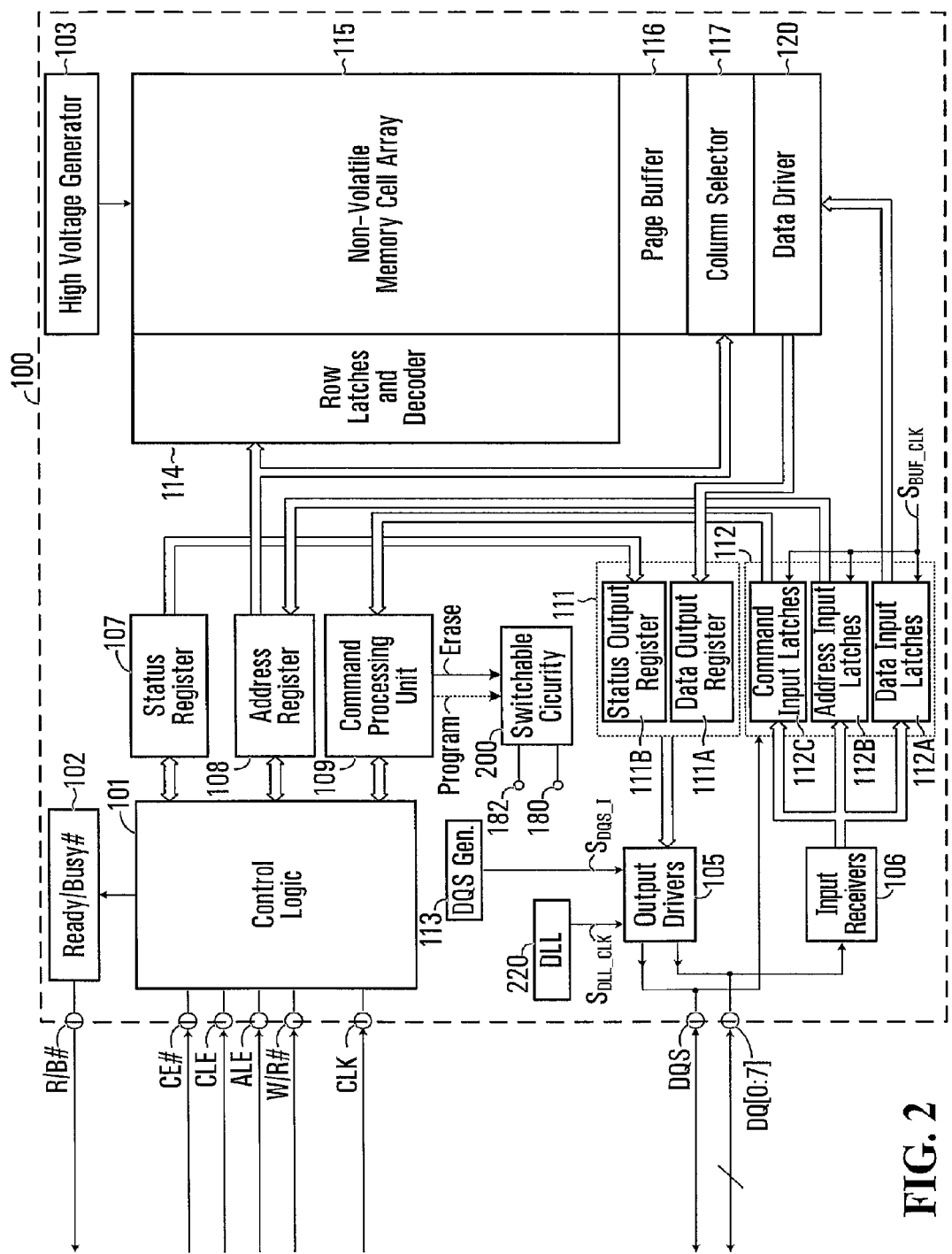
FIG. 2 is a block diagram of the non-volatile semiconductor memory device of FIG. 1 which includes switchable circuitry having an operational state dependent on an output of a command processing unit, in accordance with a non-limiting example embodiment of the present invention.

FIG. 2 is a block diagram of the non-volatile semiconductor memory device 100 in accordance with an example embodiment. Within the non-volatile semiconductor memory device 100, a non-volatile memory cell array 115 includes a plurality of non-volatile memory cells arranged in rows and columns. Each non-volatile memory cell includes a floating-gate field-effect transistor capable of holding a charge for the non-volatile storage of data. The non-volatile memory cells in the non-volatile memory cell array 115 can be electrically programmed by charging the floating gate.

The rows of the non-volatile memory cell array 115 can be arranged in blocks of pages. By way of non-limiting example, the rows of the non-volatile memory cell array 115 can be organized into 2048 blocks, with 64 pages per block.

The non-volatile semiconductor memory device 100 comprises an interface that includes the aforementioned set of ports 93A . . . 93H. More specifically, the ports of the non-volatile semiconductor memory device 100 include, without limitation:

A chip enable port (93B, also labeled CE#): The chip enable port CE# is an input port that allows the non-volatile semiconductor memory device 100 to know whether or not it has been activated by the controller 90. In the present non-limiting embodiment, when the device-external signal at the chip enable port CE# is de-asserted (LOW), this means that the non-volatile semiconductor memory device 100 has been selected, whereas when the device-external signal at the chip enable port CE# is asserted (HIGH), this means that the non-volatile semiconductor memory device 100 has been de-selected.

An input clock port (93F, also labeled CLK): The input clock port CLK is an input port that carries a clock signal (a system clock) used to synchronize operation of the non-volatile semiconductor memory device 100.

A plurality of data lines (93H, also labeled DQ[0:7]): The data lines DQ[0:7] are used to carry addresses, commands and write data from the controller 90. The data lines DQ[0:7] are also used to carry read data to the controller 90. The data lines DQ[0:7] are thus bidirectional, although it is possible to provide separate sets of unidirectional data lines for each direction of communication. While in the illustrated embodiment there are eight (8) data lines, this should not be considered a limitation. For example, in other embodiments, a different number of data lines may be provided, such as four (4) or sixteen (16). Still other possibilities exist.

A command latch enable port (93C, also labeled CLE) and an address latch enable port (93D, also labeled ALE): The command latch enable port CLE and the address latch enable port ALE are input ports that carry device-external signals which delineate the start and end of addresses, commands and/or write data on the data lines DQ[0:7].

A data strobe port (93G, also labeled DQS): The data strobe port DQS is a bidirectional port carrying a device-external signal that indicates the presence of valid data on the data lines DQ[0:7]. When data is to be written to the non-volatile semiconductor memory device 100 (in a non-limiting double data rate embodiment), the device-external signal at the data strobe port DQS is generated by the controller 90, has the same frequency as the device-external signal at the input clock port CLK, and is 90°-Qshifted and center aligned with the device-external signal on the data lines DQ[0:7]. When data is being read from the non-volatile semiconductor memory device 100 (in a non-limiting double data rate embodiment), the device-external signal at the data strobe port DQS is generated by the non-volatile semiconductor memory device 100, has the same frequency as the device-external signal at the input clock port CLK, and is edge-aligned with the device-external signal on the data lines DQ[0:7]. It should be appreciated that in the absence of valid data on the data lines DQ[0:7], the device-external signal at the data strobe port DQS can be made to not oscillate. As such, there will be periods when the device-external signal at the data strobe port DOS oscillates and periods when it does not.

A write/read port (93E, also labeled W/R#): The write/read port W/R# is an input port that carries a device-external signal indicating whether the data lines DQ[0:7] carry write data from the controller 90 (i.e., when the device-external signal W/R# is HIGH) or carry read data from the memory device 100 (i.e., when the device-external signal W/R# is LOW).

A ready/busy port (93A, also labeled R/B#): The ready/busy port R/B# is an output port that carries a device-external signal indicating whether the non-volatile semiconductor memory device 100 is available to receive a command for accessing the memory cell array 115 (when the device-external signal is HIGH) or is busy processing a command for accessing the memory cell array 115 (when the device-external signal is LOW).

Thus, ports 93B (CE#), 93C (CLE), 93D (ALE), 93E (W/R#), 93F (CLK) carry device-external signals from the controller 90 to the non-volatile semiconductor memory device 100; port 93A (R/B#) carries device-external signals from the non-volatile semiconductor memory device 100 to the controller 90; and ports 93G (DQS) and 93H (DQ[0:7]) are capable of carrying device-external signals in either direction depending on an operating mode of the non-volatile semiconductor memory device 100. The operating mode of the non-volatile semiconductor memory device 100 is itself a function of the device-external signals supplied by the controller 90 over the various input ports and data lines.

It should be appreciated that the interface of the non-volatile semiconductor memory device 100 may comprise other ports and be configured to generate or receive other device-external signals. For example, there could be provided a write protect port that provides hardware protection against unwanted programming or erasure operations. Thus, when the device-external signal at such write protect port is detected as being LOW, the non-volatile semiconductor memory device 100 can be configured to not accept certain commands involving changes to the contents of the memory cell array 115.

Internally, the non-volatile semiconductor memory device 100 includes a plurality of functional entities whose functionality will now be explained in greater detail with continued reference to FIG. 2. Those skilled in the art should appreciate that such functional entities will be described in terms of their function in order to facilitate understanding. It is expected that those skilled in the art will find it within their purview to select, arrange, configure and/or combine individual physical components (e.g., transistors, resistors, capacitors, gates, power supplies, circuits, conductive paths and the like) in order to implement the requisite functionality of a given functional entity. In doing so, those skilled in the art will recognize that certain resulting physical structures may perform the function of more than one functional entity and/or that certain functions attributed to certain functional entities are performed by more than one physical structure. Thus, the description of the functionality of a given functional entity provided below is not intended to define or limit the physical structure needed to implement such functionality.

Also, certain basic features of an integrated circuit, which would be understood by a person skilled in the art to exist, have been omitted in order to simplify the description and facilitate understanding. As an example, it should be appreciated that a first power supply (which supplies a first-level supply voltage $V_{CC}$) and a second power supply (which supplies a second-level supply voltage $V_{SS}$) are present in the non-volatile semiconductor memory device 100 and used by individual physical components where needed. By way of example, $V_{CC}$ may be positive and $V_{SS}$ may be negative, but this is not meant to limit the scope of the invention, since it is conceivable, for example, that when $V_{CC}$ is positive, $V_{SS}$ may in some cases be negative, zero or even also slightly positive. Also not illustrated or described, but nevertheless expected to be provided in the non-volatile semiconductor memory device 100 are various grounding pins, self-test circuitry and other components whose use and functionality would be well understood by those of skill in the art.

Turning now to the functional entities of the non-volatile semiconductor memory device 100 illustrated in FIG. 2, reading to and writing from the memory cell array 115 is facilitated by the provision of a row latches and decoder 114, a page buffer 116, a column selector 117, a data driver 120 and a high voltage generator 103.

Also, to allow proper reception of signals from the data lines DQ[0:7] and the data strobe port DQS, the non-volatile semiconductor memory device 100 includes input receivers 106, input latches 112 (including data input latches 112A, address input latches 112B and command input latches 112C), an address register 108 and a command processing unit 109.

Also, to allow proper transmission of signals onto the data lines DQ[0:7] and the data strobe port DQS, the non-volatile semiconductor memory device 100 includes output registers 111 (including a data output register 111A and a status output register 111B), output drivers 105 and a data strobe signal generator 113. In this specific embodiment, a clock synchronization circuit (e.g., a delay-locked loop—DLL) 220 provides a synchronizing clock signal $S_{DLL\_CLK}$ to synchronize operation of the output drivers 105. An asynchronous variant is presented in FIG. 10 and described later on in further detail.

Also, the non-volatile semiconductor memory device 100 comprises a status register 107 and a ready/busy indicator logic 102 that are useful, in combination with the aforementioned status output register 111B, for reporting state and status information to the controller 90.

Also, the non-volatile semiconductor memory device 100 includes switchable circuitry 200 connected between a node 182 and a terminal 180. The switchable circuitry 200 receives an ERASE signal and possibly also a PROGRAM signal from the command processing unit 109. Based on the ERASE signal and possibly also the PROGRAM signal, the switchable circuitry 200 controllably electrically connects or decouples the node 182 and the terminal 180, as will be described in greater detail herein below.

Also, the non-volatile semiconductor memory device 100 comprises control logic 101 that is configured to interpret the device-external signals appearing on the chip enable port CE#, the write/read port W/R#, the command latch enable port CLE and the address latch enable port ALE, as well as internal signals received from the status register 107, the address register 108 and the command processing unit 109, and to respond in a deterministic way based upon these signals.

For example, the control logic 101 is configured to recognize when the device-external signal at the command latch enable port CLE is HIGH and the device-external signal at the address latch enable port ALE is LOW. In this case, the control logic 101 considers that the information on the data lines DQ[0:7] is command information. Accordingly, the information on the data lines DQ[0:7] is received by the input receivers 106, latched by the command input latches 112C on the rising edge of a buffered clock signal $S_{BUF\_CLK}$ (which is a buffered version of the device-external signal at the input clock port CLK and has the same polarity) and provided to the command processing unit 109. The command processing unit 109 may include a register into which the information is loaded and a decoder for decoding the loaded information into one or more commands that have been issued by the controller 90.

It should be mentioned that the control logic 101 and the command processing unit 109 are being described from a functional point of view and, as will be apparent to those of skill in the art, can benefit from a wide range of implementation possibilities. For example, in some embodiments, the functionality of the command processing unit 109 is performed by the same physical components that perform the functionality of the control logic 101, while in other embodiments, the functionality of the command processing unit 109 can be performed by different physical components than those that perform the functionality of the control logic 101. In still other embodiments, part of the functionality of the command processing unit 109 can be performed by the physical components that perform the functionality of the control logic 101 while the remainder of the functionality of the command processing unit 109 can be performed by a stand-alone circuit.

There are several examples of commands that can be processed by the non-volatile semiconductor memory device 100, including BLOCK ERASE, PAGE PROGRAM, PAGE READ and STATUS READ, to name a few non-limiting possibilities. Some of these commands and their effects are described below by way of non-limiting example.

BLOCK ERASE

Figure 3:
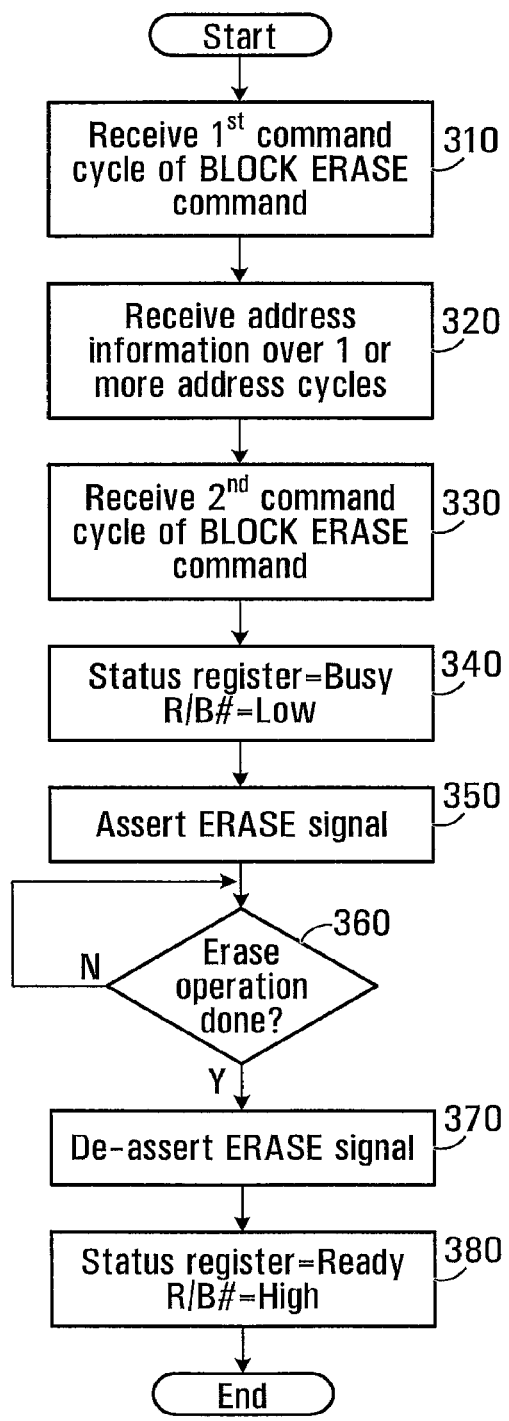
FIG. 3 is a flowchart illustrating operation of the non-volatile semiconductor memory device of FIGS. 1 and 2 in the context of and erase command, in accordance with a non-limiting example embodiment of the present invention.

Additional reference is made to the flowchart in FIG. 3, which functionally illustrates operation of the non-volatile semiconductor memory device 100. At step 310, the control logic 101 recognizes a BLOCK ERASE command (more precisely: an indicative first command cycle of the BLOCK ERASE command). Thereafter, the control logic 101 is configured to subsequently expect to receive address information on the data lines DQ[0:7]. Address information is deemed to be present on the data lines DQ[0:7] when the device-external signal at the command latch enable port CLE is LOW and the device-external signal at the address latch enable port ALE is HIGH. Accordingly, at step 320, the address information on the data lines DQ[0:7] is received by the input receivers 106, latched by the address input latches 112B on the rising edge of the aforementioned buffered clock signal $S_{BUF\_CLK}$ and transferred into the address register 108. The address information, which can span over multiple address cycles, may include a plurality of bytes specifying the address of a desired block to be erased. The address information in its entirety can be loaded into the row latches and decoder 114.

The control logic 101 is configured to subsequently expect to receive a second command cycle of the BLOCK ERASE command on the data lines DQ[0:7]. Accordingly, at step 330, when the device-external signal at the command latch enable port CLE is HIGH and the device-external signal at the address latch enable port ALE is LOW, the information on the data lines DQ[0:7] is received by the input receivers 106, latched by the command input latches 112C on the rising edge of the buffered clock signal $S_{BUF\_CLK}$ and transferred to the command processing unit 109. The command processing unit 109 recognizes the second command cycle of the BLOCK ERASE command. This information is provided to the control logic 101.

At step 340, the control logic 101 sets the status register 107 to BUSY and causes the device-external signal at the ready/busy port R/B# to go LOW in order to indicate that the non-volatile semiconductor memory device 100 is busy, in this case performing an erasure operation. At step 350 (which can be performed after, before or during step 340) the command processing unit 109 asserts the ERASE signal that is supplied to the switchable circuitry 200. Also, the control logic 101 then invokes a high voltage generator 103 to apply high voltages in order to erase the non-volatile memory cells that are within the desired block. This operation, shown at step 360, may take an extended period of time that, for current technology, is within the range of about 2 milliseconds to about 15 milliseconds, depending on a variety of factors.

After the non-volatile memory cells within desired block have been erased, the command processing unit 109 de-asserts the ERASE signal, as shown at step 370. Then, after a certain time interval, and as shown at step 380, the control logic 101 causes the device-external signal at the ready/busy port R/B# to go HIGH and sets the status register 107 to READY in order to indicate that the non-volatile semiconductor memory device 100 is ready to receive another command.

PAGE PROGRAM

When the control logic 101 recognizes a PAGE PROGRAM command (more precisely: an indicative first command cycle of the PAGE PROGRAM command), the control logic 101 is configured to subsequently expect to receive address information on the data lines DQ[0:7]. Address information is deemed to be present on the data lines DQ[0:7] when the device-external signal at the command latch enable port CLE is LOW and the device-external signal at the address latch enable port ALE is HIGH. Accordingly, the information on the data lines DQ[0:7] is received by the input receivers 106, latched by the address input latches 112B on the rising edge of the buffered clock signal $S_{BUF\_CLK}$ and transferred into the address register 108. The address information, which can span over multiple address cycles, may include a plurality of bytes specifying a desired page to be programmed. The address information can be loaded into the row latches and decoder 114 and/or the column selector 117.

The control logic 101 then expects to receive write data on the data lines DQ[0:7]. This occurs when the device-external signals at both the command latch enable port CLE and the address latch enable port ALE, as well as the device-external signal at the write/read port W/R#, are all HIGH. Additional use is made of the device-external signal at the data strobe port DQS. In this case, the write data being received by the input receivers 106 is latched by the data input latches 112A at both edges of the device-external signal at the data strobe port DQS and is loaded via the data driver 120 into the page buffer 116.

When the device-external signals at the command latch enable port CLE and the address latch enable port ALE are no longer both HIGH, the non-volatile semiconductor memory device 100 stops latching the write data, and thus the amount of write data written to the non-volatile semiconductor memory device 100 is determined by the length of time during which the device-external signals at both the command latch enable port CLE and the address latch enable port ALE had remained HIGH. For example, if the device-external signals at both the command latch enable port CLE and the address latch enable port ALE had remained HIGH for 1024 clock cycles, the non-volatile semiconductor memory device 100 would have received 2048 bytes of write data (for an 8-bit-wide data bus in a double data rate scenario).

The control logic 101 is configured to subsequently expect to receive a second command cycle of the PAGE PROGRAM command on the data lines DQ[0:7]. Accordingly, when the device-external signal at the command latch enable port CLE is HIGH and the device-external signal at the address latch enable port ALE is LOW, the information on the data lines DQ[0:7] is received by the input receivers 106, latched by the command input latches 112C on the rising edge of the buffered clock signal $S_{BUF\_CLK}$ and transferred into the command processing unit 109. The command processing unit 109 recognizes the second command cycle of the PAGE PROGRAM command.

The command processing unit 109 then sets the status register 107 to BUSY and asserts the PROGRAM signal which may be supplied to the switchable circuitry 200 in certain embodiments of the present invention. In addition, either before, during or after assertion of the PROGRAM signal, the control logic 101 causes the device-external signal at the ready/busy port R/B# to go LOW in order to indicate that the non-volatile semiconductor memory device 100 is busy, in this case performing a programming operation. The control logic 101 then invokes the high voltage generator 103 to apply high voltages in order to transfer the write data in the page buffer 116 to the desired page in the non-volatile memory cell array 115. This operation may take an extended period of time that, for current technology, is within the range of about 200 microseconds to about 2 milliseconds, depending on a variety of factors.

After the non-volatile memory cells within the desired page have been programmed, the command processing unit 109 de-asserts the PROGRAM signal. Then, after a certain time interval, the control logic 101 causes the device-external signal at the ready/busy port R/B# to go HIGH and sets the status register 107 to READY in order to indicate that the non-volatile semiconductor memory device 100 is ready to receive another command.

PAGE READ

When the control logic 101 recognizes a PAGE READ command (more precisely: an indicative first command cycle of the PAGE READ command), the control logic 101 is configured to subsequently expect to receive address information on the data lines DQ[0:7]. Address information is deemed to be present on the data lines DQ[0:7] when the device-external signal at the command latch enable port CLE is LOW and the device-external signal at the address latch enable port ALE is HIGH. Accordingly, the information on the data lines DQ[0:7] is received by the input receivers 106, latched by the address input register 112B on the rising edge of the buffered clock signal $S_{BUF\_CLK}$ and transferred into the address register 108. The address information, which can span over multiple address cycles, may include a plurality of bytes specifying a desired page to be read. The address information can be loaded into the row latches and decoder 114 and/or the column selector 117.

The control logic 101 is configured to subsequently expect to receive a second command cycle of the PAGE READ command on the data lines DQ[0:7]. Accordingly, when the device-external signal at the command latch enable port CLE is HIGH and the device-external signal at the address latch enable port ALE is LOW, the information on the data lines DQ[0:7] is received by the input receivers 106, latched by the data input latches 112A on the rising edge of the buffered clock signal $S_{BUF\_CLK}$ and transferred into the command processing unit 109. The command processing unit 109 recognizes the second command cycle of the PAGE READ command.

In addition, the control logic 101 sets the status register 107 to BUSY and causes the device-external signal at the ready/busy port R/B# to go LOW in order to indicate that the non-volatile semiconductor memory device 100 is busy. The control logic 101 then invokes the high voltage generator 103 to apply high voltages in order to transfer the cell data in the desired page in the non-volatile memory cell array 115 to the page buffer 116. This operation may take a certain amount of time that, for current technology, is within the range of about 20 microseconds to about 60 microseconds, depending on a variety of factors.

After the contents of the desired page have been transferred to the page buffer 116, the control logic 101 causes the device-external signal at the ready/busy port R/B# to go HIGH and sets the status register 107 to READY in order to indicate that the non-volatile semiconductor memory device 100 is ready to output the read data in the page buffer 116 or to receive another command.

The control logic 101 then expects to output read data onto the data lines DQ[0:7]. For this to happen, the device-external signals on both the command latch enable port CLE and the address latch enable port ALE have to be HIGH and the device-external signal at the write/read port W/R# has to be LOW. Then, the data in the page buffer 116 is output to the data lines DQ[0:7] through the data output register 111A and the output drivers 105. This is carried out in a synchronous manner. Specifically, the data from the page buffer 116 is loaded via the data driver 120 into the data output register 111A. The output drivers 105 thus sequentially receive the read data from the data output register 111A. The output drivers 105 output the read data received from the data output register 111A onto the data lines DQ[0:7] in synchronism with the synchronizing clock signal $S_{DLL\_CLK}$.

Meanwhile, the output drivers 105 receive an internally generated data strobe signal $S_{DQS\_I}$ that is produced by the data strobe signal generator 113. The internally generated data strobe signal $S_{DQS\_I}$ is HIGH when there is read data to be placed on the data lines DQ[0:7] and is LOW otherwise. The output drivers 105 transfer the internally generated data strobe signal $S_{DQS\_I}$ onto the data strobe port DQS, synchronizing it with the rising and falling edges of the aforementioned synchronizing clock signal $S_{DLL\_CLK}$. The device-external signal issued via the data strobe port DQS is used by the controller 90 for latching data present on the data lines DQ[0:7] during read operations.

When the device-external signals at the command latch enable port CLE and the address latch enable port ALE are no longer both HIGH, the non-volatile semiconductor memory device 100 stops outputting the read data, and thus the amount of read data read from the non-volatile semiconductor memory device 100 is determined by the length of time during which the device-external signals on both the command latch enable port CLE and the address latch enable port ALE had remained HIGH. For example, if the device-external signals at the command latch enable port CLE and the address latch enable port ALE had remained HIGH for 1024 clock cycles, the non-volatile semiconductor memory device 100 would have output 2048 bytes of read data (for an 8-bit-wide data bus in a double data rate scenario).

STATUS READ

When the control logic 101 recognizes a STATUS READ command, the control logic 101 is configured to expect that it will subsequently need to output status information on the data lines DQ[0:7]. For this to take place, the device-external signals at both the command latch enable port CLE and the address latch enable port ALE have to be HIGH and the device-external signal at the write/read port W/R# has to be LOW. In this case, the contents of the status register 107 is output to the data lines DQ[0:7] through the status output register 111B and the output drivers 105. This status read operation is also done in a synchronous manner, namely while the output drivers 105 are transferring the internally generated data strobe signal $S_{DQS\_I}$ onto the data strobe port DQS in synchronism with the rising and falling edges of the synchronizing clock signal $S_{DLL\_CLK}$.

Thus, it will be apparent that the ERASE signal is asserted by the command processing unit 109 when the BLOCK ERASE command (in particular, the second command cycle of the BLOCK ERASE command) received from the controller 90 is recognized. The ERASE signal is de-asserted by the command processing unit 109 when the erasure operation performed further to receipt of the BLOCK ERASE is complete.

In some embodiments, the PROGRAM signal is asserted by the command processing unit 109 when the PAGE PROGRAM command (in particular, the second command cycle of the PAGE PROGRAM command) received from the controller 90 is recognized. The PROGRAM signal is de-asserted by the command processing unit 109 when the programming operation performed further to receipt of the PAGE PROGRAM is complete.

The ERASE signal provided by the command processing unit 109 is used to influence the behavior of the switchable circuitry 200. Specifically, the switchable circuitry 200 can be controlled to toggle between a first operational state in which the node 182 is electrically connected to the terminal 180 and a second operational state in which the node 182 is electrically decoupled from the terminal 180, in dependence upon the ERASE signal. In some embodiments, if the PROGRAM signal is provided by the command processing unit 109, such can be used to influence the behavior of the switchable circuitry 200 in a similar manner.

The terminal 180 is connected to one or more of the functional entities of the non-volatile semiconductor memory device 100, for which the node 182 supplies a signal when the switchable circuitry 200 is in the first operational state. The identity of the at least one functional entity, the nature of the signal supplied by the node 182, as well as the configuration of the switchable circuitry 200, can be different in different embodiments.

Figure 4:
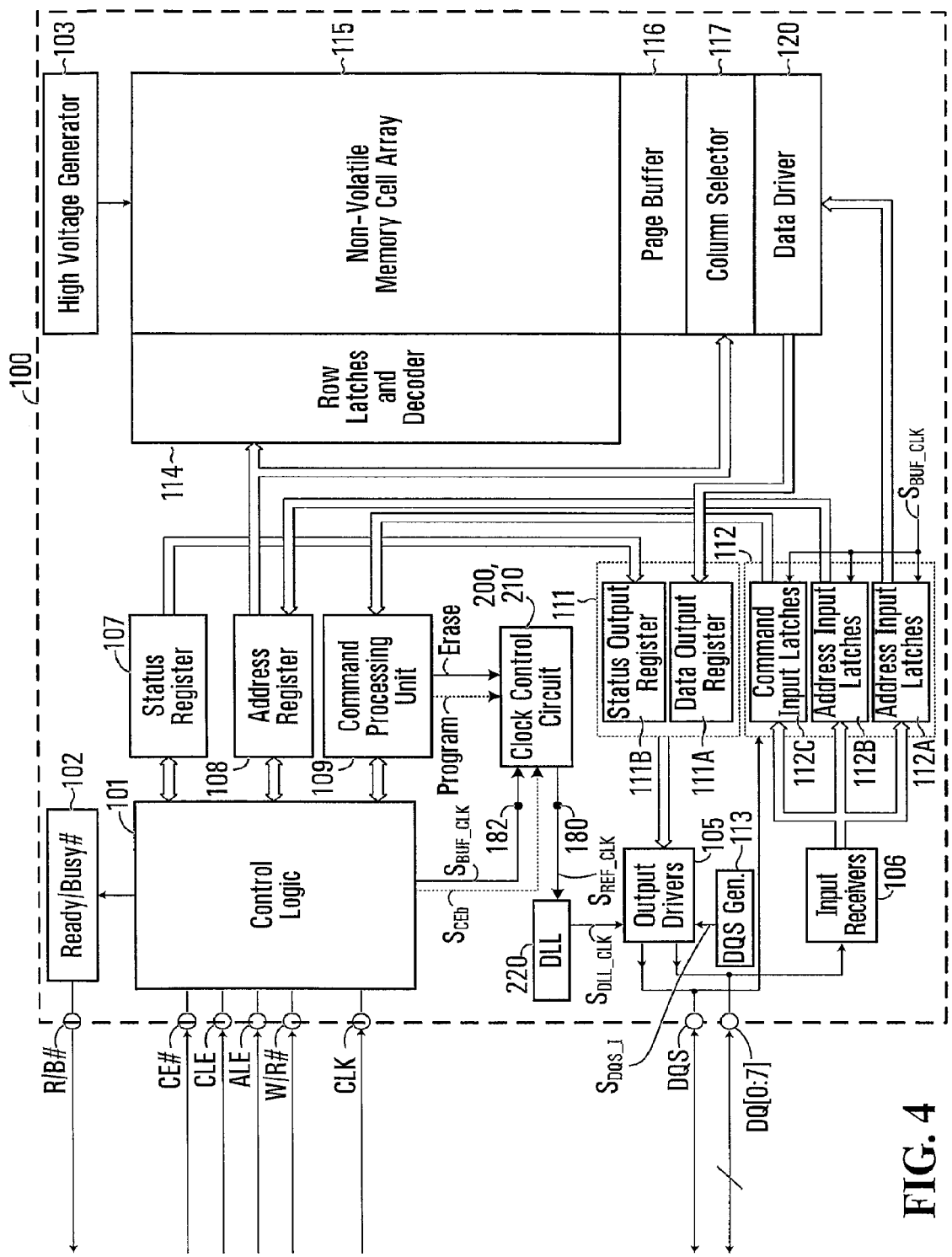
FIG. 4 is a block diagram of the non-volatile semiconductor memory device of FIGS. 1 and 2 wherein the switchable circuitry includes a clock control circuit, in accordance with a non-limiting example embodiment of the present invention.

Block Diagram of FIG. 4

For example, as shown in FIG. 4, the one or more of the functional entities to which terminal 180 is connected corresponds to the DLL 220. In this case, the signal supplied by the node 182 is the buffered clock signal $S_{BUF\_CLK}$ and the switchable circuitry 200 includes a clock control circuit 210.

One non-limiting example embodiment of the clock control circuit 210 and the DLL 220 is now described with reference to FIG. 5A. Specifically, the clock control circuit 210 derives a reference clock signal $S_{REF\_CLK}$ from the aforementioned buffered clock signal $S_{BUF\_CLK}$, as well as from the ERASE signal and/or the PROGRAM signal. The clock control circuit 210 feeds the reference clock signal $S_{REF\_CLK}$ to the DLL 220, which produces the synchronizing clock signal $S_{DLL\_CLK}$.

To generate the reference clock signal $S_{REF\_CLK}$, the clock control circuit 210 controllably switches between a first operational state in which the reference clock signal $S_{REF\_CLK}$ tracks the buffered clock signal $S_{BUF\_CLK}$ and a second operational state in which the reference clock signal $S_{REF\_CLK}$ is decoupled from the buffered clock signal $S_{BUF\_CLK}$. In this embodiment, the ERASE signal and the PROGRAM signal play a role in whether the reference clock signal $S_{REF\_CLK}$ tracks the buffered clock signal $S_{BUF\_CLK}$ or is decoupled therefrom. Specifically, and in accordance with a non-limiting example embodiment, the clock control circuit 210 is designed to enter into/remain in the first operational state (i.e., in which the reference clock signal $S_{REF\_CLK}$ tracks the buffered clock signal $S_{BUF\_CLK}$) when neither the ERASE signal nor the PROGRAM signal is asserted by the command processing unit 109. Conversely, the clock control circuit 210 is designed to enter into/remain in the second operational state (i.e., in which the reference clock signal $S_{REF\_CLK}$ is decoupled from the buffered clock signal $S_{BUF\_CLK}$) when at least one of the ERASE signal and the PROGRAM signal is asserted by the command processing unit 109.

Accordingly, in a specific non-limiting embodiment, the clock control circuit 210 can be designed to include an AND logic gate 211 and a NOR logic gate 213. The NOR logic gate 213 is fed by the ERASE signal and the PROGRAM signal from the command processing unit 109. A first input of the AND logic gate 211 is the buffered clock signal $S_{BUF\_CLK}$. A second input of the AND logic gate 211 is a signal $S_{DLL\_EN2}$ that is an output of the NOR logic gate 213. Thus, when the ERASE signal or the PROGRAM signal is asserted, the NOR logic gate 213 causes the signal $S_{DLL\_EN2}$ to go LOW, which disables the AND logic gate 211 and causes its output signal (i.e., the reference clock signal $S_{REF\_CLK}$) to go LOW. This decouples the reference clock signal $S_{REF\_CLK}$ from the buffered clock signal $S_{BUF\_CLK}$. On the other hand, when the ERASE signal and the PROGRAM signal are de-asserted, the NOR logic gate 213 causes the signal $S_{DLL\_EN2}$ to go HIGH, which enables the AND logic gate 211 and causes the reference clock signal $S_{REF\_CLK}$ to track the buffered clock signal $S_{BUF\_CLK}$ while it is provided to the DLL 220.

In one alternative embodiment, the AND logic gate 211 can be a 3-input AND logic gate, with the third input being a signal $S_{DLL\_EN1}$, which is at the output of an inverter logic gate 212 fed by a buffered chip enable signal $S_{CEb}$. The buffered chip enable signal $S_{CEb}$ is a buffered version of the device-external signal at the chip enable port CE# and has the same polarity. This modification of the clock control circuit 210 would cause the AND logic gate 211 to operate as described earlier whenever the buffered chip enable signal $S_{CEb}$ goes LOW (i.e., whenever the non-volatile semiconductor memory device 100 is selected), but would result in the output of the AND logic gate 211 going LOW whenever the buffered chip enable signal $S_{CEb}$ goes HIGH (i.e., whenever the non-volatile semiconductor memory device 100 is de-selected), irrespective of whether the ERASE signal or the PROGRAM signal is asserted or not.

In another alternative embodiment, the functionality of the NOR logic gate 213 is implemented elsewhere than in the clock control circuit 210. For example, the functionality of the NOR logic gate 213 could be implemented in the command processing unit 109. As such, the command processing unit 109 may itself issue the signal $S_{DLL\_EN2}$ that is currently illustrated as being at the output of the NOR logic gate 213.

The DLL 220 includes circuit components in a feedback loop configuration to produce the synchronizing clock signal $S_{DLL\_CLK}$ with a controllable delay relative to the reference clock signal $S_{REF\_CLK}$. The controllable delay can be adjusted as needed to ensure that the output drivers 105, which receive the synchronizing clock signal $S_{DLL\_CLK}$, output the device-external signals on the data lines DQ[0:7] and at the data strobe port DQS to meet desired timing specifications for the non-volatile semiconductor memory device 100. To achieve the requisite delay, the DLL 220 can be implemented as a conventional DLL that includes a variable delay line 221. The variable delay line 221 varies a delay of the synchronizing clock signal $S_{DLL\_CLK}$ relative to the reference clock signal $S_{REF\_CLK}$ in response to a delay adjustment signal $S_{SHIFT}$.

A feedback delay model 224 generates a feedback clock signal $S_{FB\_CLK}$ in response to the synchronizing clock signal $S_{DLL\_CLK}$. The feedback delay model 224 may have a replica delay model which compensates for internal delays caused by some internal circuit blocks such as:

the AND logic gate 211 in the clock control circuit 210;

an input buffer (not shown) that outputs the buffered clock signal $S_{BUF\_CLK}$ from the device-external signal at the input clock port CLK; and/or output buffers for the device-external signals on the data lines DQ[0:7] and at the data strobe port DOS.

The DLL 220 further includes a phase detector 222 that receives the feedback clock signal $S_{FB\_CLK}$ and the reference clock signal $S_{REF\_CLK}$, and generates a phase error signal $S_{PE}$ having a value indicating the phase difference between the reference clock signal $S_{REF\_CLK}$ the and feedback clock signal $S_{FB\_CLK}$. A delay control 223 generates the delay adjustment signal $S_{SHIFT}$ in response to the phase error signal $S_{PE}$ from the phase detector 222, and applies the delay adjustment signal $S_{SHIFT}$ to the variable delay line 221 to adjust the delay applied by the variable delay line 221.

The phase detector 222 and the delay control 223 operate in combination to adjust the delay applied by the variable delay line 221 as a function of the detected phase difference between the reference clock signal $S_{REF\_CLK}$ and the feedback clock signal $S_{FB\_CLK}$. Specifically, the phase detector 222 and the delay control 223 operate in combination to adjust the variable delay of the synchronizing clock signal $S_{DLL\_CLK}$ until the phase difference between the reference clock signal $S_{REF\_CLK}$ and feedback clock signal $S_{FB\_CLK}$ is approximately zero. More specifically, as the delay of the synchronizing clock signal $S_{DLL\_CLK}$ is adjusted, the phase of the feedback clock signal $S_{FB\_CLK}$ from the feedback delay model 224 is adjusted accordingly until the feedback clock signal $S_{FB\_CLK}$ has approximately the same phase as the reference clock signal $S_{REF\_CLK}$. When the DLL 220 has adjusted the variable delay to a value causing the phase shift between the reference clock signal $S_{REF\_CLK}$ and the feedback clock signal $S_{FB\_CLK}$ to equal approximately zero, the DLL 220 is said to be "locked". At this point, the device-external signal at the input clock port CLK and the synchronizing clock signal $S_{DLL\_CLK}$ will be synchronized provided that the feedback delay model 224 accurately models the various internal delays.

Considering that the variable delay line 221 in the DLL 220 may contain a large number of delay stages, all of which are switched as an oscillating clock signal propagates through the variable delay line 221, it is clear that a power savings will arise during times when the DLL 220 is not fed with an oscillating clock signal. This, in turn, occurs when the reference clock signal $S_{REF\_CLK}$ decoupled from the buffered clock signal $S_{BUF\_CLK}$, which is a direct consequence of asserting the ERASE signal or the PROGRAM signal as described earlier. Overall, it will therefore be observed that the average number of signal transitions per second that are effected by the DLL 220 will be less when the reference clock signal $S_{REF\_CLK}$ is decoupled from the buffered clock signal $S_{BUF\_CLK}$ than when the reference clock signal $S_{REF\_CLK}$ tracks the buffered clock signal $S_{BUF\_CLK}$. This results in a power savings that is particularly significant at higher clock signal frequencies.

Figure 5A:
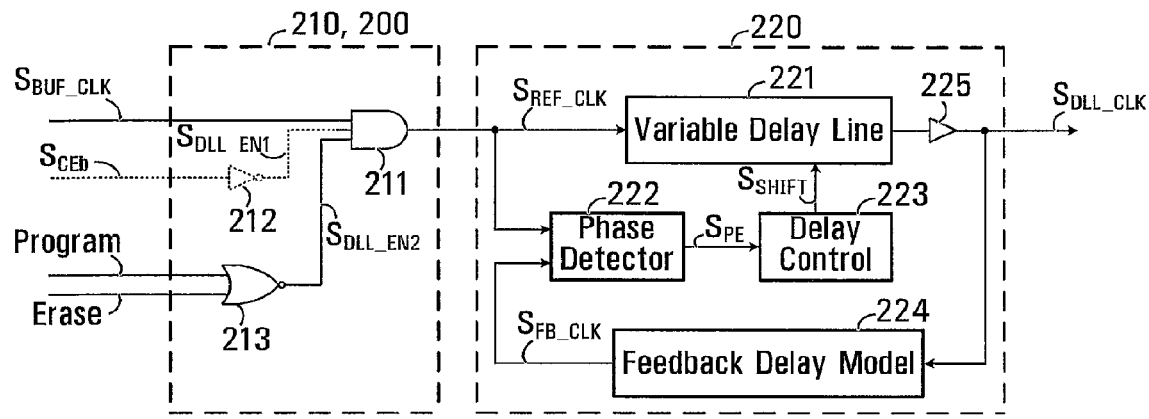
FIG. 5A is a block diagram of the clock control circuit of FIG. 4 together with a clock synchronization circuit, in accordance with a non-limiting example embodiment of the present invention.

A variant of the clock control circuit 210 shown in FIG. 5A is now described with reference to FIG. 5B, which shows a clock control circuit $210_B$ that is similar to the clock control circuit 210 in FIG. 5A, with the following main difference. Specifically, the second input of an AND logic gate $211_B$ is a signal $S_{DLL\_EN}$ which is output by a 2-input OR logic gate 234. The 2-input OR logic gate 234 is fed by the output of the NOR logic gate 213 (which, it is recalled, is fed by the ERASE signal and the PROGRAM signal) and the output of the inverter logic gate 212 (which, it is recalled, is fed by the buffered chip enable signal $S_{CEb}$).

In operation, the modified clock control circuit $210_B$ causes the AND logic gate $211_B$ to transfer the buffered clock signal $S_{BUF\_CLK}$ over to its output (which carries the reference clock signal $S_{REF\_CLK}$) whenever either one of the following conditions is met: (i) the buffered chip enable signal $S_{CEb}$ goes LOW (i.e., whenever the non-volatile semiconductor memory device 100 is selected) or (ii) the ERASE signal and the PROGRAM signal are de-asserted (=LOW). Conversely, the reference clock signal $S_{REF\_CLK}$ will be decoupled from the buffered clock signal $S_{BUF\_CLK}$ only when both (i) the buffered chip enable signal $S_{CEb}$ goes HIGH (i.e., whenever the non-volatile semiconductor memory device 100 is de-selected) and (ii) the ERASE signal or the PROGRAM signal is asserted (=HIGH). Simply stated, when compared to the clock control circuit 210 in FIG. 5A, the modified clock control circuit $210_B$ in FIG. 5B does not automatically decouple the reference clock signal $S_{REF\_CLK}$ from the buffered clock signal $S_{BUF\_CLK}$ when the ERASE signal or the PROGRAM signal is asserted, but requires the additional condition whereby the non-volatile semiconductor memory device 100 has been de-selected. Stated differently, selecting the non-volatile semiconductor memory device 100 will activate the DLL 220, thus over-riding the effect of the ERASE signal or the PROGRAM signal. While this may lead to less of a power savings than in the circuit of FIG. 5A, it nevertheless allows greater control of the operation of the non-volatile semiconductor memory device 100 directly from the controller 90.

Figure 6A:
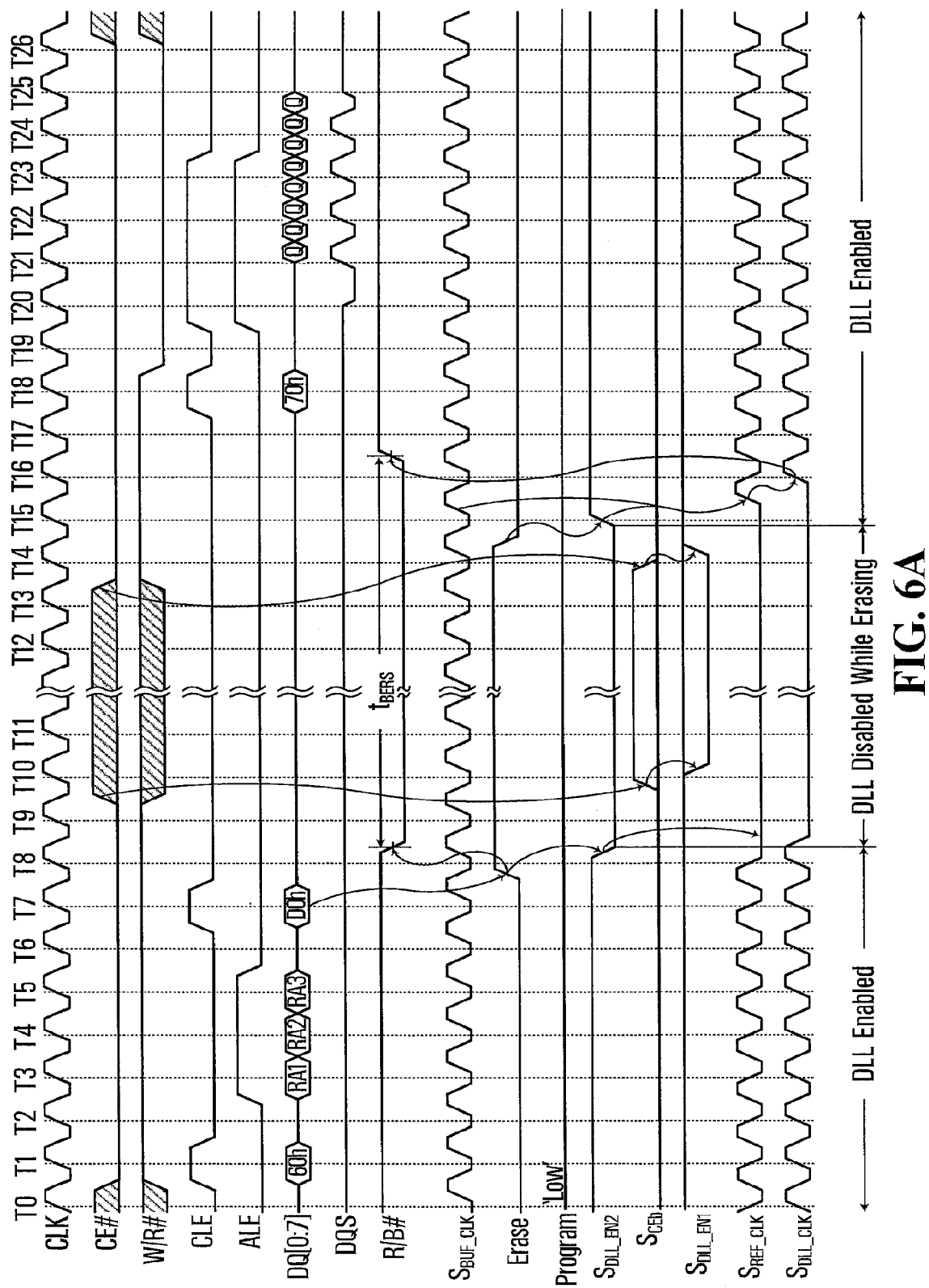
FIG. 6A is a timing diagram that shows signal transitions of various signals associated with the clock control circuit and the clock synchronization circuit of FIG. 5A.

FIG. 6A is a non-limiting example timing diagram that shows signal transitions of various signals associated with the clock control circuit 210 and the DLL 220 in FIG. 5A during and after receipt of a BLOCK ERASE command. Those skilled in the art will appreciate that similar timing diagrams could be provided for other commands (e.g., PAGE PROGRAM), but have been omitted since it is believed that they are not required in order for the reader to acquire an understanding of example embodiments.

The control signals in the top portion of FIG. 6A (namely those at the input clock port CLK, the chip enable port CE#, the write/read port W/R#, the command latch enable port CLE, the address latch enable port ALE, the data lines DQ[0:7], the data strobe port DQS and the ready/busy port R/B#) are issued by the controller 90.

Between times T1 through T7, the non-volatile semiconductor memory device 100 receives a first cycle of the BLOCK ERASE command (60h), row address information (RA1, RA2 & RA3) and a second cycle of the BLOCK ERASE command (D0h). Once the non-volatile semiconductor memory device 100 receives and decodes the second cycle of the BLOCK ERASE command (D0h), the ERASE signal is asserted at time T8 and the $S_{DLL\_EN2}$ signal (at the output of the NOR logic gate 213) goes LOW. The AND logic gate 211 is then disabled by the LOW state of the $S_{DLL\_EN2}$ signal. Therefore, the reference clock signal $S_{REF\_CLK}$ goes to the LOW state at around time T8. As a result, the synchronizing clock signal $S_{DLL\_CLK}$ stops toggling even though the buffered cock signal $S_{BUF\_CLK}$ keeps toggling. In addition, the device-external signal at the ready/busy port R/B# signal goes LOW.

The non-volatile semiconductor memory device 100 then performs an internal "erase and verify" operation on the non-volatile memory cell array 115 for a time specified as $t_{BERS}$ (Block Erase Time), which varies and can be, for example, 2 ms for a SLC (Single Level Cell) type NAND flash memory device or, for example, 15 ms maximum for some types of MLC (Multi-Level-Cell) NAND flash memory devices. During the time that the non-volatile semiconductor memory device 100 is completing the internal "erase and verify" operation, the DLL 220 is effectively disabled, thus leading to less power consumption than if it were enabled during this time.

Somewhere between times T14 and T15, the non-volatile semiconductor memory device 100 finishes its final "erase and verify" operation and the ERASE signal goes to the LOW state. As a result, the $S_{DLL\_EN2}$ signal goes back to the HIGH state at time T15, which enables the AND logic gate 211. Therefore, the reference clock signal $S_{REF\_CLK}$ starts to track the buffered clock signal $S_{BUF\_CLK}$ again, and the DLL 220 tries to lock the synchronizing clock signal $S_{DLL\_CLK}$ according to the reference clock signal $S_{REF\_CLK}$ and the feedback clock signal $S_{FB\_CLK}$. Those skilled in the art will appreciate that when the DLL 220 comprises a delay locked loop, a certain number of clock cycles may be needed for the synchronizing clock signal $S_{DLL\_CLK}$ to re-acquire synchronization (i.e., to "re-lock"). The timing diagram in FIG. 6A assumes a simplified and short re-locking sequence such that the synchronizing clock signal $S_{DLL\_CLK}$ is already locked at time T16. Suitable re-locking sequences are known in the art and therefore not described here.

After the synchronizing clock signal $S_{DLL\_CLK}$ has re-acquired synchronization, the device-external signal at the ready/busy port R/B# signal goes HIGH as shown between times T16 and T17. The non-volatile semiconductor memory device 100 now becomes "ready" and the controller 90 may issue another command such as, without limitation, STATUS READ, PAGE READ, PAGE PROGRAM and BLOCK ERASE.

Figure 5B:
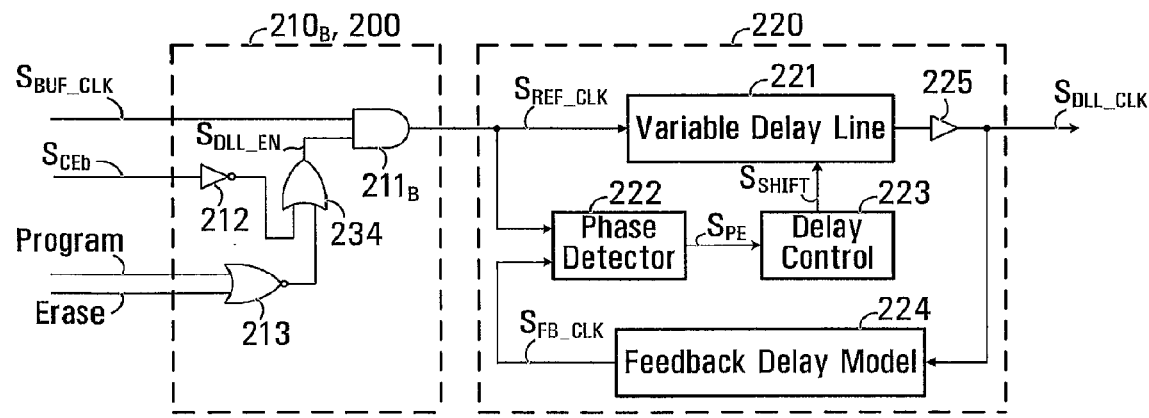
FIG. 5B is a block diagram of the clock control circuit of FIG. 4 together with the a clock synchronization circuit, in accordance with another non-limiting example embodiment of the present invention.
Figure 6B:
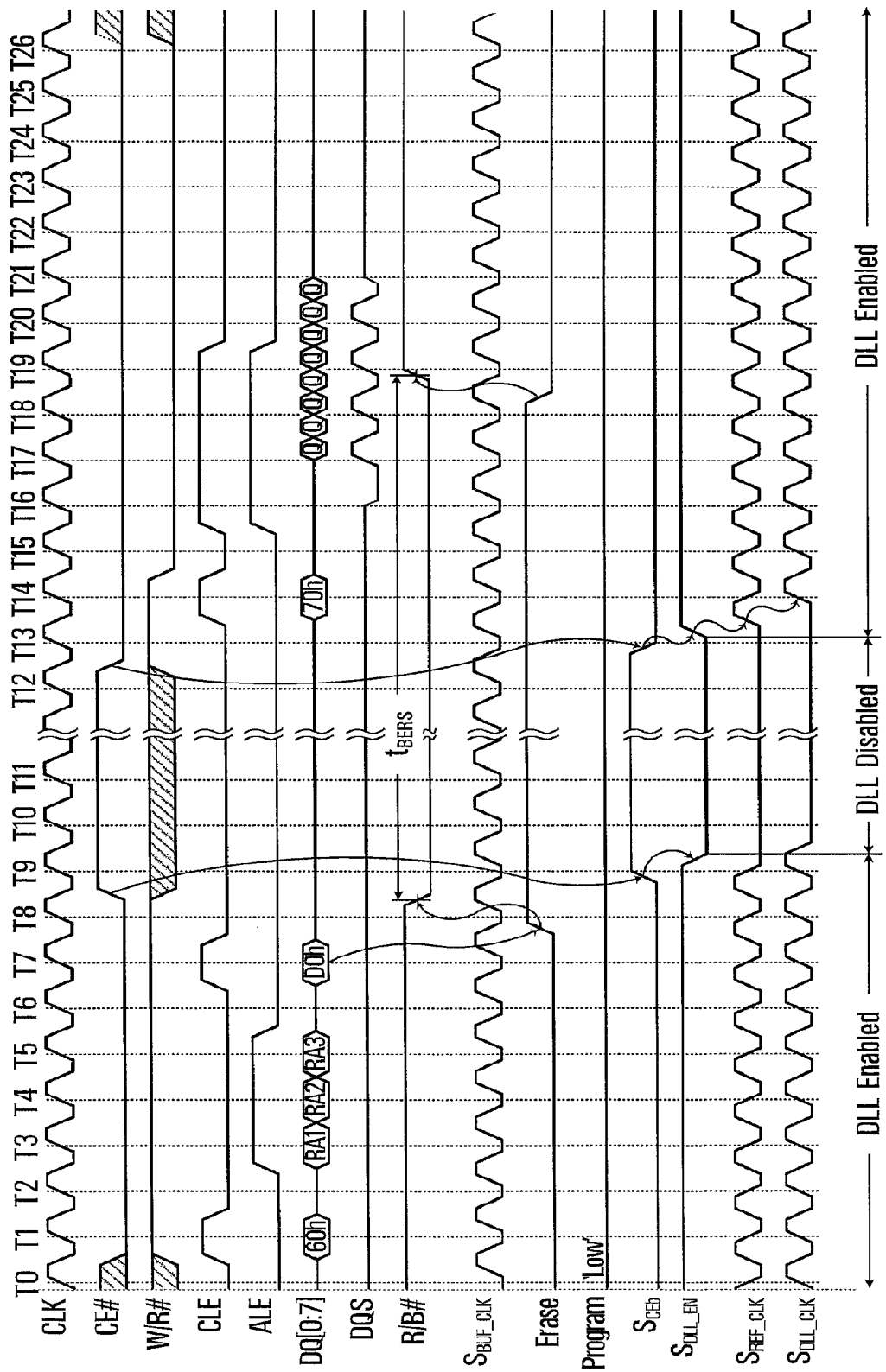
FIG. 6B is a timing diagram that shows signal transitions of various signals associated with the clock control circuit and the clock synchronization circuit of FIG. 5B.

FIG. 6B is a non-limiting example timing diagram for the signals associated with the clock control circuit 210 and the DLL 220 in FIG. 5B during a BLOCK ERASE command. The timing diagram in FIG. 6B is similar to that of FIG. 6A, with the following exceptions. Specifically, between times T7 and T8, it will be noted that the $S_{DLL\_EN}$ signal at the second input of the AND logic gate 211$_B$ has not dropped to the LOW state even though the ERASE signal is asserted. This is because buffered chip enable signal $S_{CEb}$ signal is still in the LOW state (meaning that the non-volatile semiconductor memory device 100 remains selected), which in this embodiment overrides the clock signal decoupling effect otherwise controlled by the ERASE signal. Then, after the device-external signal at the chip enable port CE# goes to the HIGH state (between times T8 and T9), the buffered chip enable signal $S_{CEb}$ also goes to the HIGH state, and now the $S_{DLL\_EN}$ signal goes to the LOW state. This disables the AND logic gate 211$_B$, causing the reference clock signal $S_{REF\_CLK}$ to stop toggling so that the DLL 220 does not expend power needlessly.

Those skilled in the art will appreciate that although the clock synchronization circuit has been illustrated as the DLL 220, it may be configured differently and may comprise other types of circuit components in a feedback loop configuration. For example the DLL 220 could be used in conjunction with, or replaced by, a phase-locked loop (PLL), which could be deactivated for a period of time while the ERASE signal (and/or the PROGRAM signal) is asserted.

Figure 7:
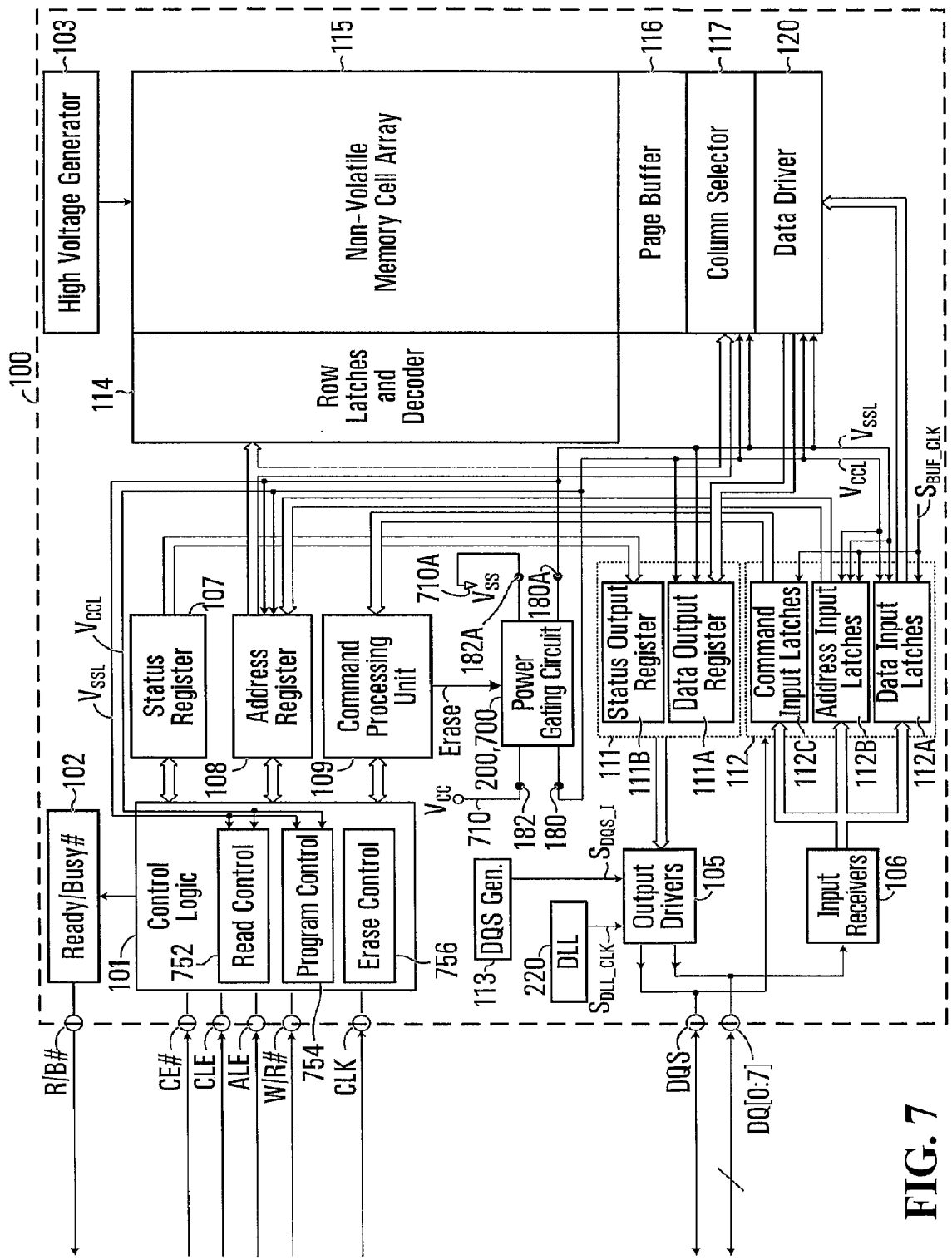
FIG. 7 is a block diagram of the non-volatile memory device of FIGS. 1 and 2 wherein the switchable circuitry includes a power gating circuit, in accordance with a non-limiting example embodiment of the present invention.

Another example embodiment of the switchable circuitry 200 is shown in FIG. 7. In particular, the switchable circuitry 200 implements a power gating circuit 700. In this embodiment, the node 182 leads to the aforementioned first power supply, which has been heretofore omitted from the drawings but is now illustrated and given the reference numeral 710. The first power supply 710, which can be provided internally or can be generated off-chip and received via a device pin, is kept at a first-level supply voltage $V_{CC}$. The terminal 180 provides a modified first-level supply voltage $V_{CCL}$ to a subset of one or more functional entities among the functional entities forming part of the non-volatile semiconductor memory device 100.

Additionally, in the illustrated embodiment, a node 182A is provided, and leads to the aforementioned second power supply, also heretofore omitted from the drawings but now illustrated and given the reference numeral 710A. The second power supply 710A, which can be provided internally or can be generated off-chip and received via a device pin, is kept at a second-level (e.g., lower) supply voltage $V_{SS}$. A second terminal 180A is provided and supplies a modified second-level supply voltage $V_{SSL}$ to the aforementioned subset of one or more functional entities.

Although the illustration of the power gating circuit 700 in FIG. 7 appears to be centralized, one should appreciate that the physical circuitry of the power gating circuit 700 may be distributed throughout various regions of a semiconductor chip.

Figure 8:
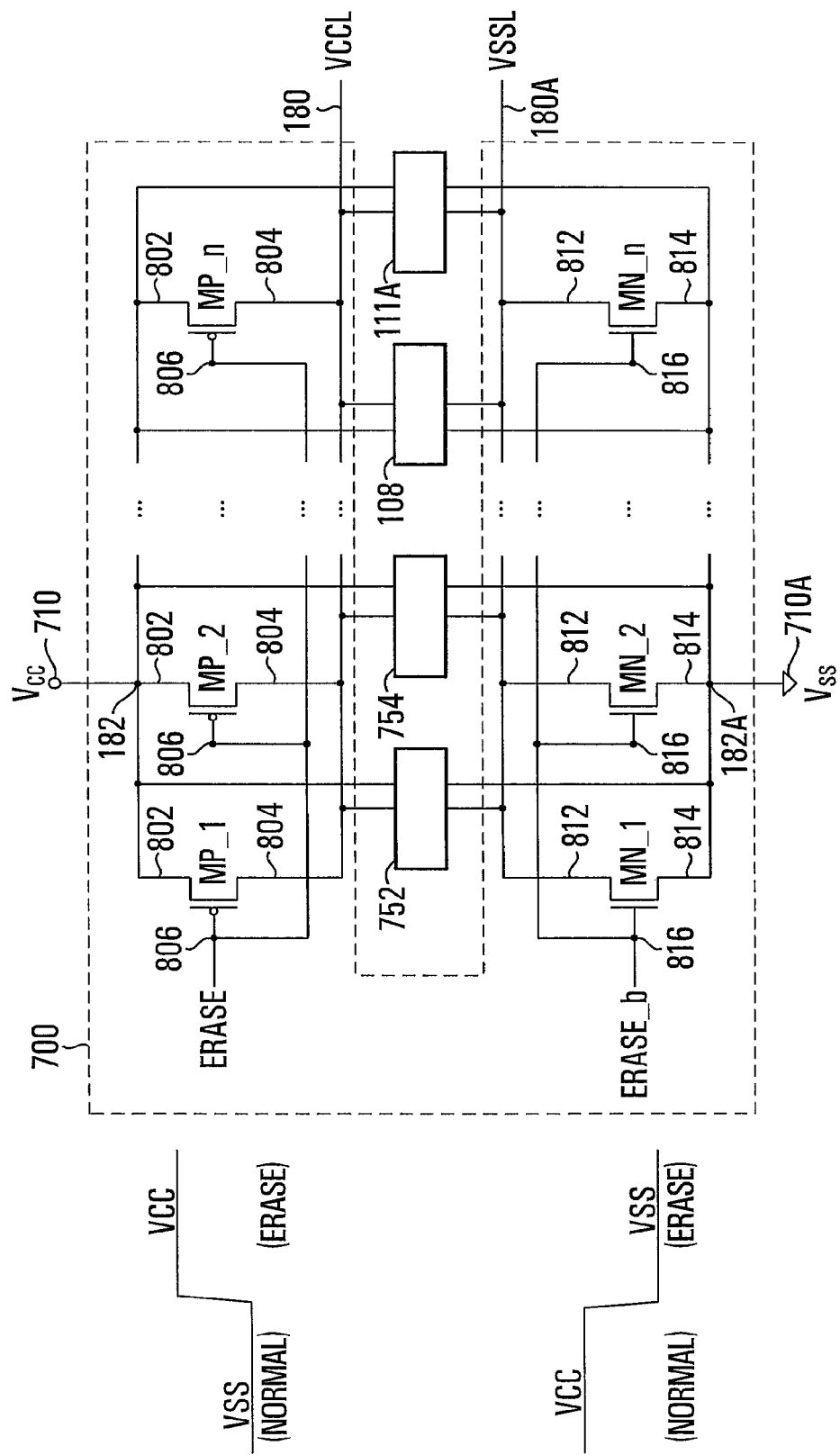
FIG. 8 is a circuit diagram of the power gating circuit of FIG. 7, in accordance with a non-limiting example embodiment of the present invention.

It should also be understood that in some embodiments the power gating circuit 700 will include only one node and one terminal, and it is inconsequential whether these are node 180 and terminal 182, or node 180A and terminal 182A. An embodiment of the power gating circuit 700 is shown in FIG. 8. This embodiment of the power gating circuit 700 outputs the modified first-level supply voltage $V_{CCL}$ at terminal 180 based on the original first-level supply voltage $V_{CC}$ at node 182 and also outputs the modified second-level supply voltage $V_{SSL}$ at terminal 180A based on the original second-level supply voltage $V_{SS}$ at node 182A. Of course, it is to be understood that not all embodiments of the power gating circuit 700 need provide both modified supply voltages.

In order to output the modified first-level supply voltage $V_{CCL}$ based on the original first-level supply voltage $V_{CC}$, the power gating circuit 700 comprises a plurality of PMOS transistors MP_1, MP_2, . . . , MP_n, each comprising a source terminal 802, a drain terminal 804 and a gate terminal 806. The source terminal 802 of each of the PMOS transistors MP_1, MP_2, . . . , MP_n is connected to the first power supply 710 via node 182. The drain terminals 804 of the PMOS transistors MP_1, MP_2, . . . , MP_n are shown as connected together and, referring back to FIG. 7, are shown as collectively leading to the aforementioned subset of the functional entities via terminal 180. It should be understood that although the depiction of the PMOS transistors MP_1, MP_2, . . . , MP_n is physical, the depicted interconnection of their drain terminals 804 and source terminals 802 is functional in nature. In a physical implementation, it will be understood that the drain terminals 804 (or the source terminals 802) of the PMOS transistors MP_1, MP_2, . . . , MP_n need not be connected together, and that the actual number of PMOS transistors MP_1, MP_2, . . . , MP_n will reflect the number of physical instances where the modified first-level supply voltage $V_{CCL}$ is being supplied in lieu of the original first-level supply voltage $V_{CC}$.

Similarly, in order to output the modified second-level supply voltage $V_{SSL}$ based on the original second-level supply voltage $V_{SS}$, the power gating circuit 700 comprises a plurality of NMOS transistors MN_1, MN_2, . . . , MN_n, each comprising a drain terminal 812, a source terminal 814 and a gate terminal 816. The source terminal 814 of each of the NMOS transistors MN_1, MN_2, . . . , MN_n is connected to the second power supply 710A via node 182A. The drain terminals 812 of the NMOS transistors MN_1, MN_2, . . . , MN_n are shown as connected together and, referring back to FIG. 7, are shown as collectively leading to the aforementioned subset of the functional entities via terminal 180A. It should be understood that although the depiction of the NMOS transistors MN_1, MN_2, ..., MN_n is physical, the depicted interconnection of their drain terminals 812 and source terminals 814 is functional in nature. In a physical implementation, it will be understood that the drain terminals 812 (or the source terminals 814) of the NMOS transistors MN_1, MN_2, ..., MN_n need not be connected together, and that the actual number of NMOS transistors MN_1, MN_2, ..., MN_n will reflect the number of physical instances where the modified second-level supply voltage $V_{SSL}$ is being supplied in lieu of the original second-level supply voltage $V_{SS}$.

Figure 9:
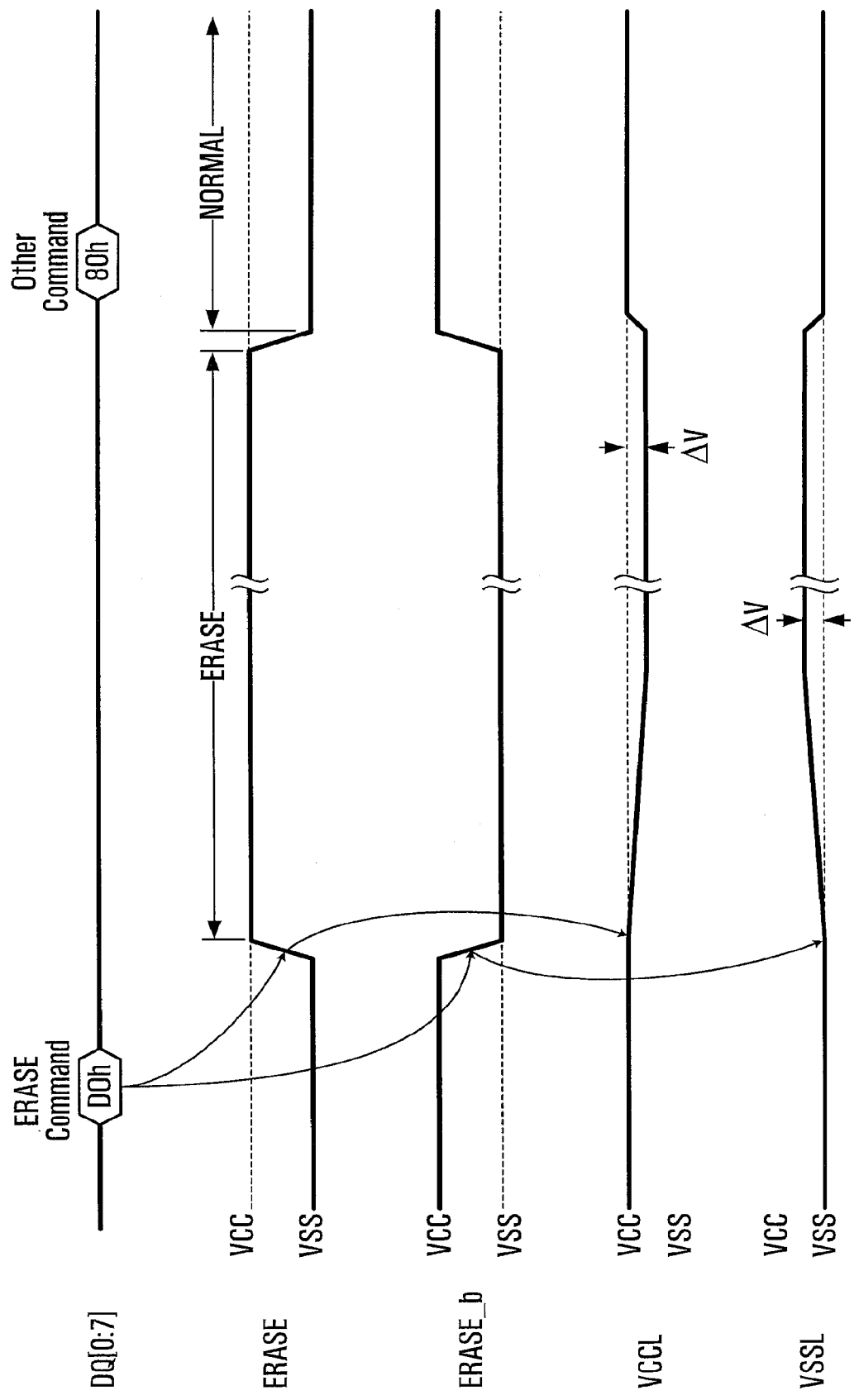
FIG. 9 is a timing diagram showing a change over time in voltage levels supplied by the circuit illustrated in FIG. 8, in accordance with a non-limiting example embodiments of the present invention.

With continued reference to FIG. 8 and with additional reference to FIG. 9, the gate terminal 806 of each of the PMOS transistors MP_1, MP_2, ..., MP_n is fed by the ERASE signal from the command processing unit 109, while the gate terminal 816 of each of the NMOS transistors MN_1, MN_2, ..., MN_n is fed by a complement of the ERASE signal. The complement of the ERASE signal can be obtained directly from the command processing unit 109 or can be derived internally within the power gating circuit 700 by passing the ERASE signal through inverter circuitry. The ERASE signal varies between two levels (HIGH and LOW), which are defined by the first-level and second-level supply voltages $V_{CC}$ and $V_{SS}$, respectively.

Thus, when the ERASE signal is LOW (i.e., not asserted, or de-asserted, by the command processing unit 109), the gate terminals 806 of the PMOS transistors MP_1, MP_2, ..., MP_n are placed at the second-level supply voltage $V_{SS}$, which is sufficiently below the (negative) threshold voltage of the PMOS transistors MP_1, MP_2, ..., MP_n to place them into saturation, leading to the each PMOS transistor's source terminal 802 being connected to its drain terminal 804. As a result, node 182 is electrically connected to terminal 180, and the modified first-level supply voltage $V_{CCL}$ matches the original first-level supply voltage $V_{CC}$.

Meanwhile, since the complement of the ERASE signal is HIGH, the gate terminals 816 of the NMOS transistors MN_1, MN_2, ..., MN_n are placed at the first-level supply voltage $V_{SS}$, which is sufficiently above the (positive) threshold voltage of the NMOS transistors MN_1, MN_2, ..., MN_n to place them into saturation, leading to the each NMOS transistor's source terminal 814 being connected to its drain terminal 812. As a result, node 182A is electrically connected to terminal 180A, and the modified second-level supply voltage $V_{SSL}$ matches the original second-level supply voltage $V_{SS}$.

On the other hand, when the ERASE signal goes HIGH (i.e., upon assertion by the command processing unit 109), the gate terminals 806 of the PMOS transistors MP_1, MP_2, ..., MP_n are placed at the first-level supply voltage $V_{CC}$, which is above the (positive) threshold voltage of the PMOS transistors MP_1, MP_2, ..., MP_n, thus electrically decoupling each PMOS transistor's source terminal 802 from its drain terminal 804. As a result, node 182 is decoupled from terminal 180 and the modified first-level supply voltage $V_{CCL}$ begins to deviate from the original first-level supply voltage $V_{CC}$.

Meanwhile, since the complement of the ERASE signal is LOW, the gate terminals 816 of the NMOS transistors MN_1, MN_2, ..., MN_n are placed at the second-level supply voltage $V_{SS}$, which is below the (negative) threshold voltage of the NMOS transistors MN_1, MN_2, ..., MN_n, thus electrically decoupling each NMOS transistor's source terminal 814 from its drain terminal 812. As a result, node 182A is decoupled from terminal 180A and the modified second-level supply voltage $V_{SSL}$ begins to deviate from the original second-level supply voltage $V_{SS}$.

The gradual deviation of the modified first-level supply voltage $V_{CCL}$ and the modified second-level supply voltage $V_{SSL}$ from their respective original values $V_{CC}$ and $V_{SS}$ is attributable to a phenomenon known as subthreshold current leakage in a self-reverse-biased transistor. This effect has been documented by T. Kawahara, M. Horiguchi, Y. Kawajiri, G. Kitsukawa, T. Kure, and M. Aoki, "*Subthreshold Current Reduction for Decoded-Driver by Self-Reverse Biasing*," IEEE J. Solid-State Circuits 28, No. 11, pp. 1136-1144 (November 1993), hereby incorporated by reference herein. Further information about the general nature of this process can also be obtained by consulting U.S. Pat. No. 7,292,061 to HakJune Oh, issued on Nov. 6, 2007 and hereby incorporated by reference herein.

One observation from FIG. 9, which is a consequence of the subthreshold current leakage phenomenon, is that the modified first-level supply voltage $V_{CCL}$ decreases over time from its original value of $V_{CC}$ to a smaller value $V_{CC}-\Delta V$. Similarly, the modified second-level supply voltage $V_{SSL}$ increases over time from its original value of $V_{SS}$ to a larger value $V_{SS}-\Delta V$. In both cases, the modified first-level and second-level supply voltages decrease in absolute value from a respective initial value until each stabilizes around a respective final value.

With reference again to FIG. 7, consideration is now given to the subset of functional entities that are supplied with the modified first-level supply voltage $V_{CCL}$ and the modified second-level supply voltage $V_{SSL}$ in lieu of the original supply voltages $V_{CC}$ and $V_{SS}$. Recalling also from FIG. 9 that during certain periods of time after the ERASE signal has been asserted, the modified first-level supply voltage $V_{CCL}$ is less than the original first-level supply voltage $V_{CC}$ (and that the modified second-level supply voltage $V_{SSL}$ is greater than the original second-level supply voltage $V_{SS}$), it will be appreciated that the net effect of this reduction in absolute value of the voltages used to supply the subset of functional entities is a reduction in the power consumed by those functional entities. Thus, power consumption of the non-volatile semiconductor memory device 100 as a whole can be reduced while the ERASE signal is asserted, i.e., during the operations performed by the non-volatile semiconductor memory device 100 in response to the BLOCK ERASE command.

Naturally, altering the voltage supplied to a given functional entity in the subset of functional entities may have an effect on the given functional entity's performance. Nevertheless, overall performance of the non-volatile semiconductor memory device 100 need not be affected, particularly if the given functional entity is deemed "eligible", i.e., its output is not relied upon while the non-volatile semiconductor memory device 100 completes the erasure operation (see step 360 in FIG. 3). Indeed, the more such "eligible" functional entities that can be identified, the greater the power savings is likely to be.

Accordingly, functional entities that are more likely to qualify as "eligible" may include one or more of: the address input latches 112A, the data input latches 112B, the data output register 111A, the address register 108, the column selector 117 and the data driver 120. Additionally, by breaking down the control logic 101 into sub-modules, such as a read control sub-module 752 (dedicated to processing a READ command), a program control sub-module 754 (dedicated to processing a PROGRAM command), and an erase program control sub-module 756 (dedicated to processing a PROGRAM command), one will notice that the read control sub-module 752 and the program control sub-module 754 may constitute "eligible" functional entities.

By way of non-limiting example in FIG. 8, functional entities 752, 754, 108 and 111A are illustrated as receiving the modified first- and second-level supply voltages $V_{CCL}$ and $V_{SSL}$, respectively, in addition to the first- and second-level supply voltages $V_{CC}$ and $V_{SS}$, respectively. Of course, the functional entities to which the power gating circuit 700 is connected may differ, and may be greater or smaller in number, from one embodiment to the next.

Conversely, functional entities that are less likely to qualify as "eligible" are those whose output is—or may need to be—relied upon while the non-volatile semiconductor memory device 100 completes the erasure operation. Such functional entities include the erase control sub-module 756. For example, where the non-volatile semiconductor memory device 100 is required to provide status information at any time in response to a STATUS READ command, including during the erasure operation commenced in response to a BLOCK ERASE command, then the input receivers 106, the command input latches 112C, the command processing unit 109, the status register 107, the status output register 111B, the data strobe signal generator 113 and the output drivers 105 (as well as the DLL 220) need to remain fully operational, meaning that they need to be powered by the original first-level and second-level supply voltages $V_{CC}$ and $V_{SS}$. However, where there is no requirement to respond to a STATUS READ command while performing an erasure operation, the input receivers 106, the command input latches 112C, the command processing unit 109, the status register 107, the status output register 111B, the data strobe signal generator 113 and the output drivers 105 (as well as the DLL 220) can qualify as "eligible" to be supplied with the modified first-level supply voltage $V_{CCL}$ and the modified second-level supply voltage $V_{SSL}$ in lieu of the original supply voltages $V_{CC}$ and $V_{SS}$.

Those skilled in the art should appreciate that still other functional entities can be identified as "eligible" functional entities in order to still further reduce power consumption following receipt of the BLOCK ERASE command. Also, it is within the scope of the invention to control the gates 806 and 816 of the transistors in the power gating circuitry 700 also based on the PROGRAM signal. This can be done by implementing a logic OR gate that accepts the ERASE signal and the PROGRAM signal. Those skilled in the art are expected to be capable of assessing whether the subset of "eligible" functional entities requires modification when the PROGRAM signal is also used to trigger the power gating circuitry.

It will be appreciated that the longer the operation during which node 182 (and node 182A) can be electrically decoupled from terminal 180 (and terminal 180A) without impacting overall performance of the non-volatile semiconductor memory device 100, the greater the power savings will be.

Those skilled in the art should appreciate that a multi-purpose circuit may be devised, which provides the combined functionality of the switchable circuitry 200 in the embodiments of FIGS. 4 and 7 (namely the clock control circuit 210 and the power gating circuit 700).

Figure 10:
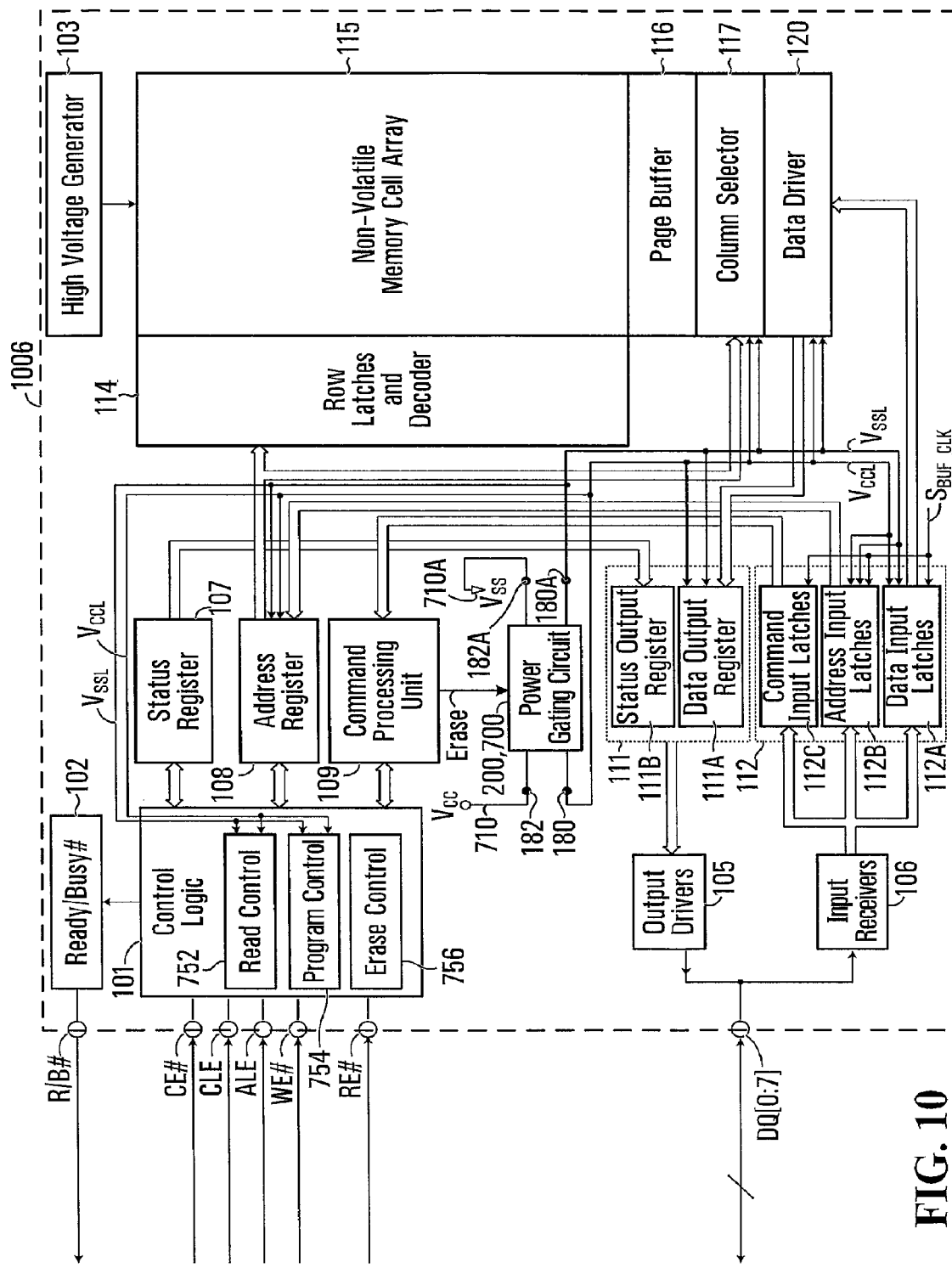
FIG. 10 is a block diagram of a non-volatile memory device having switchable circuitry that includes a power gating circuit, in accordance with a different non-limiting example embodiment of the present invention.

Those skilled in the art should also appreciate that although the above description has focused on a synchronous non-volatile semiconductor memory device, the power gating circuit 700 may similarly be used to reduce power consumption in an asynchronous non-volatile semiconductor memory devices. For example, FIG. 10 is a block diagram of a non-volatile semiconductor memory device 100B in accordance with an example embodiment. Non-volatile semiconductor memory device 100B is identical to non-volatile semiconductor memory device 100 shown in FIG. 7 with the exception that it is not furnished with a clock signal from the controller. Also, instead of a write/read port, there is provided a write enable port (WE#) and a read enable port (RE#). Further, there is no data strobe port within the non-volatile semiconductor memory device 100B, and consequently no data strobe signal generator. There is also no DLL as there is no need for synchronization in the case of an asynchronous device.

In order to control the writing of data to the non-volatile semiconductor memory device 100B of FIG. 10, the controller issues a PAGE PROGRAM command while asserting a signal on the write enable port WE#, and follows this with data to be written while keeping the signal on the write enable port WE# asserted. In order to control the reading of data from the non-volatile semiconductor memory device 100B of FIG. 10, the controller issues a PAGE READ command while asserting the signal on the write enable port WE#, and then, after a pre-determined delay that allows the non-volatile semiconductor memory device 100B to fetch the data from the memory cell array 115, switches into a mode where a signal on the read enable port RE# is asserted.

The command processing unit 109 functions in the same manner as before, and thus upon recognizing a BLOCK ERASE command (more particularly, the second command cycle of a BLOCK ERASE command), the command processing unit 109 asserts the ERASE signal, leading to a decoupling of terminal 180 (and/or terminal 180A) from node 182 (and/or node 182A).

Those skilled in the art should appreciate that the above description of the BLOCK ERASE, PAGE PROGRAM, PAGE READ and STATUS READ commands is merely illustrative, and that various modifications are possible without departing from the scope of embodiments of the invention. In addition, other current or future commands may trigger assertion of the ERASE and/or PROGRAM signals. For instance, consider the case of a hypothetical PAGE ERASE command analogous to the above described BLOCK ERASE command, but which allows a single page of a particular multi-page block to be erased without affecting the other block(s) in the page. An example of such a command is described in U.S. patent application Ser. No. 11/779,685 to Jin-Ki KIM, entitled "Partial Block Erase Architecture for Flash Memory", hereby incorporated by reference herein.

It will also be understood that the non-volatile semiconductor memory devices 100, $100_A$, $100_B$ described above can be implemented using various types of non-volatile memory integrated circuit technology, including but not limited to NAND Flash EEPROM, NOR Flash EEPROM, AND Flash EEPROM, DiNOR Flash EEPROM, Serial Flash EEPROM, Erasable Programmable ROM (EPROM), Ferroelectric Random-Access Memory (FRAM), Magnetoresistive RAM (MRAM) and Phase-Change RAM (PCRAM).

It should also be appreciated that in some embodiments, certain signals, in particular but without limitation the clock signals and the data strobe signals, can be single-ended while in other embodiments these signals can be differential.

It should also be appreciated that in some embodiments, certain devices, in particular the input registers 112 and the output drivers 105, can be responsive to rising edges, falling edges or both rising edges and falling edges, thereby exhibiting single data rate (SDR), double data rate (DDR) or quadruple data rate (QDR) functionality.

Referring again to FIG. 1, the memory system 80 may, in some examples, be at least substantially compliant with the flash standard described in "Open NAND Flash Interface Specification", Revision 2.0, Feb. 27, 2008, the entire contents of which are herein incorporated by reference. Of course the memory system 80 may, in other examples, be at least substantially compliant with some other flash standard that is consistent with providing memory devices that include DLLs and/or PLLs.

It should also be appreciated that in some embodiments, the memory devices 100, 100$_A$, 100$_B$ can be provided with the above-described functionality at least partly through the use of a software program that is run on a computer. Such a software program could be encoded as computer-readable instructions on a computer-readable storage medium, the instructions being designed to convert the above-described functionality into low-level circuit diagrams and/or integrated circuit configurations for achieving the above describe functionality.

Certain adaptations and modifications of the described embodiments can be made. Therefore, the above discussed embodiments are considered to be illustrative and not restrictive.

The invention claimed is:

1. A method comprising:
    causing a non-volatile semiconductor memory device to switch from a first operational state to a second operational state in response to recognizing an erase command or a program command received by the non-volatile semiconductor memory device;
    electrically connecting a voltage supply terminal of the non-volatile semiconductor memory device to a node of the non-volatile semiconductor memory device when the non-volatile semiconductor memory device is in the first operational state;
    electrically decoupling the voltage supply terminal from the node when the non-volatile semiconductor memory device is in the second operational state;
    causing the non-volatile semiconductor memory device to switch from the second operational state back to the first operational state; and
    issuing a status signal to indicate that the non-volatile semiconductor memory device is ready, after the non-volatile semiconductor memory device is caused to switch back to the first operational state.

2. The method defined in claim 1, further comprising starting an erase operation, if and after the erase command is recognized.

3. The method defined in claim 2, wherein the causing of the non-volatile semiconductor memory device to switch from the second operational state back to the first operational state occurs before the erase operation is complete.

4. The method defined in claim 1, further comprising starting a program operation, if and after the program command is recognized.

5. The method defined in claim 4, wherein the causing of the non-volatile semiconductor memory device to switch from the second operational state back to the first operational state occurs before the program operation is complete.

6. The method defined in claim 1, wherein the node leads to a power supply for supplying power to circuitry of the non-volatile semiconductor memory device when the voltage supply terminal is electrically connected to the node.

7. The method defined in claim 6, wherein prior to switching from the first operational state to the second operational state, a voltage at the voltage supply terminal matches a voltage of the power supply and wherein after switching from the first operational state to the second operational state, the voltage at the voltage supply terminal begins to decrease in absolute value.

8. The method defined in claim 7, wherein the decrease in absolute value continues until the voltage at the voltage supply terminal stabilizes at around a final level.

9. The method defined in claim 1, further comprising outputting a signal indicative that the device is busy in further to recognizing the erase command or the program command.

10. The method defined in claim 9, wherein the outputting of the signal indicative that the device is busy occurs after the causing of the non-volatile semiconductor memory device to switch from the first operational state to the second operational state.

11. The method defined in claim 1, wherein the non-volatile semiconductor memory device is a NAND flash memory device.

12. The method defined in claim 1, wherein the non-volatile semiconductor memory device is a NOR flash memory device.

13. The method defined in claim 1, wherein:
    the node is an internal voltage node, and
    a first voltage at the internal voltage node is different from a second voltage associated with the voltage supply terminal.

14. The method defined in claim 1, wherein the node is an internal voltage node.

* * * * *